United States Patent
Antici et al.

(10) Patent No.: US 11,236,437 B2
(45) Date of Patent: Feb. 1, 2022

(54) METHOD AND SYSTEM FOR FABRICATION OF CRYSTALS USING LASER-ACCELERATED PARTICLE BEAMS OR SECONDARY SOURCES

(71) Applicant: INSTITUT NATIONAL DE LA RECHERCHE SCIENTIFIQUE, Quebec (CA)

(72) Inventors: Patrizio Antici, Montreal (CA); Marianna Barberio, Crucoli (IT)

(73) Assignee: INSTITUT NATIONAL DE LA RECHERCHE SCIENTIFIQUE

( * ) Notice: Subject to any disclaimer, the term of this patent is extended or adjusted under 35 U.S.C. 154(b) by 121 days.

(21) Appl. No.: 16/115,131

(22) Filed: Aug. 28, 2018

(65) Prior Publication Data
US 2019/0062945 A1 Feb. 28, 2019

Related U.S. Application Data

(60) Provisional application No. 62/550,910, filed on Aug. 28, 2017.

(51) Int. Cl.
| | |
|---|---|
| C23C 14/34 | (2006.01) |
| C23C 14/46 | (2006.01) |
| C30B 23/06 | (2006.01) |
| C30B 29/02 | (2006.01) |
| C23C 14/28 | (2006.01) |

(52) U.S. Cl.
CPC ........... C30B 23/066 (2013.01); C23C 14/28 (2013.01); C23C 14/3464 (2013.01); C23C 14/3485 (2013.01); C23C 14/46 (2013.01); C30B 29/02 (2013.01)

(58) Field of Classification Search
None
See application file for complete search history.

(56) References Cited

U.S. PATENT DOCUMENTS

| | | | | |
|---|---|---|---|---|
| 5,064,520 A | * | 11/1991 | Miyake | C23C 14/12 204/192.11 |
| 5,064,620 A | * | 11/1991 | Beuret | C23C 8/20 422/95 |
| 5,080,455 A | * | 1/1992 | King | C03C 17/22 204/192.11 |
| 10,705,036 B2 | * | 7/2020 | Antici | G01N 23/2257 |
| 2001/0000334 A1 | * | 4/2001 | Ruth | G01N 1/2035 436/181 |

(Continued)

OTHER PUBLICATIONS

Richard J. Lewis, Sr., editor; Hawley's Condensed Chemical Dictionary, 12th edition; Van Nostrand Reinhold Company, New York; 1993 (no month); excerpt p. 324.*

(Continued)

*Primary Examiner* — Dah-Wei D. Yuan
*Assistant Examiner* — Kristen A Dagenais-Englehart
(74) *Attorney, Agent, or Firm* — Lavery, De Billy, LLP; Gwendoline Bruneau

(57) ABSTRACT

A system and a method for fabricating crystals, the method comprising heating an irradiation target to a temperature comprised in a range between a boiling point temperature of a material of the irradiation target and a critical point temperature of the material of the irradiation target, thereby generating a plasma plume of particles ablated from a surface of the irradiation target.

13 Claims, 16 Drawing Sheets

(56) References Cited

U.S. PATENT DOCUMENTS

| | | | | |
|---|---|---|---|---|
| 2001/0000335 | A1* | 4/2001 | Yamada | H01L 33/18 |
| | | | | 438/1 |
| 2002/0014441 | A1* | 2/2002 | Yoshida | G01N 15/0266 |
| | | | | 209/127.1 |
| 2012/0244032 | A1* | 9/2012 | Lappalainen | C30B 23/02 |
| | | | | 420/433 |
| 2014/0017416 | A1* | 1/2014 | Liu | C23C 14/28 |
| | | | | 427/597 |
| 2015/0069667 | A1* | 3/2015 | Li | C23C 14/0005 |
| | | | | 264/442 |
| 2016/0289819 | A1* | 10/2016 | Lyngnes | C23C 14/0036 |
| 2018/0002806 | A1* | 1/2018 | Verbeck, IV | C23C 14/28 |

OTHER PUBLICATIONS

Y.L. Wang et al.; "Nucleation and growth of nanoparticles during pulsed laser deposition in ambient gas"; Laser and Particle Beams; vol. 29; pp. 105-111; 2011 (no month).*

Roth, M. et al., Bright Laser-Driven Neutron Source Based on the Relativistic Transparency of Solids, Phys. Rev. Lett. 110, 044802 (2013), (5 pages).

Roth, M. et al., Fast Ignition by Intense Laser-Accelerated Proton Beams, Phys. Rev. Lett. 86, 436 (2001), vol. 83, No. 3, pp. 436-439.

Scisciò, M., et al., Analysis of induced stress on materials exposed to laser-plasma radiation during high-intense laser experiments, Applied Surface Science 421, 200 (2017).

Shi, G. and Kioupakis, E., Electronic and Optical Properties of Nanoporous Silicon for Solar-Cell Applications, ACS Photonics 2, 208 (2015), pp. 208-215.

Shinoda, W., Shiga, M., and Mikami, M., Rapid estimation of elastic constants by molecular dynamics simulation under constant stress, Phys. Rev. B., 69, 134103 (2004).

Snavely, R. A. et al., Intense High-Energy Proton Beams from Petawatt-Laser Irradiation of Solids, Phys. Rev. Lett. 85, 2945 (2000), vol. 85, No. 14; pp. 2945-2948.

Stuart, B. C., et al., The Titan Laser at LLNL, Conference on Lasers and Electro-Optics/Quantum Electronics and Laser Science Conference and Photonic Applications Systems Technologies, Technical Digest (CD) (Optical Society of America, 2006), paper JTuG3.

Tong, H., Ouyang, S., BI, S., Numezawa, E., Oshikiri, M., YE, J., Nano-photocatalytic materials: possibilities and challenges, Adv. Mater, 24, 229 (2012), pp. 229-251.

Tuckerman, M., Alejandre, J., Lopez-Rendon, R., Jochim, A., and Martyna, G., A Liouville-operator derived measure-preserving integrator for molecular dynamics simulations in the isothermal-isobaric ensemble, J. Phys. A: Math. Gen., 39, 5629 (2006), pp. 5629-5650.

Ung, A., Request for Proposals—MSKCC—Cornell U54 Center for Translation of Cancer Nanomedicines (NIH/NCI U54CA199081) mc2ten.cornell.edu/content/uploads/2016/06/U54-Developmental-Program-RFA.pdf.

Veltri, S., Sokullu, E., Barberio, M., Gauthier, M.A., Antici, P., Synthesis and characterization of thin-transparent nanostructured films for surface protection, Superlattices and Microstructures 101, 209 (2017), pp. 209-218.

Wilks, S. C., Kruer, W. L., Tabak, M. and Langdon, A. B., Absorption of ultra-intense laser-pulses, Phys. Rev. Lett. 69, 1383 (1992), vol. 69, No. 9; pp. 1383-1386.

Ziegler, J. F., Stopping of energetic light iions in elemental matter, Journal of Applied Physics, vol. 85, No. 3, 1249-1272 (1999).

Abbott, A., Laser centre lights up eastern Europe, Nature, 489, 351 (2012); Powell, D., Europe sets sights on lasers, Nature 500, 7462 (2013), vol. 489; p. 351.

Adams, J.B., Foiles, S. M., Wolfer, W. G., Self-diffusion and impurity diffusion of FCC metals using the 5-frequency model and the Embedded Atom Method, J. Mater. Res. 4, 102-112 (1989).

Albertazzi, B. et al., Laboratory formation of a scaled protostellar jet by coaligned poloidal magnetic field, Science 346, 325 (2014), vol. 346; issue 6207; pp. 325-328.

Antici, P. et al., Isochoric heating of matter by laser-accelerated high-energy protons, J. Phys. IV France, 133: 1077-1079, (2006).

Antici, P. et al., Numerical study of a linear accelerator using laser-generated proton beams as a source, Jour. Appl. Phys. 104, 124901 (2008), (7 pages).

Aydin, K., Ferry, V. E., Briggs, R. M., and Atwater, H. A., Broadband polarization-independent resonant light absorption using ultrathin plasmonic super absorbers, Nature Comm., 2, 517 (2011), (7 pages).

Barberio, M., Antici, P., In situ study of nucleation and aggregation phases for nanoparticles grown by laser-driven methods, Sci. Rep. 7, 41372 (2017), Feb. 14, 2017.

Barberio, M., et al., Laser-Accelerated Particle Beams for Stress Testing of Materials, Nat. Comm. 9, 372 (2018), (7 pages).

Barberio, M., Grosso, D.R., Imbrogno, A., Xu, F., Preparation and photovoltaic properties of layered $TiO_2$/carbon nanotube/$TiO_2$ photoanodes for dye-sensitized solar cells, 158-164, (2016).

Barberio, M., Imbrogno, A., Stranges, F., Bonanno, A., Xu, F., Controlled synthesis of ZnS quantum dots with cubic crystallinity by laser ablation in solution, Materials Research Express 2 (5), 055008 (2015), (8 pages).

Barberio, M., Scisciò, M., Vallières, S., Veltri, S., Morabito, A., Antici, P., Laser-Generated Proton Beams for High-Precision Ultra-Fast Crystal Synthesis, Sci. Rep. 7, 12522 (2017), published Oct. 2, 2017.

Barberio, M., Veltri, S., Imbrogno, A., Stranges, F., Bonanno, A., Antici, P, $TiO_2$ and $SiO_2$ nanoparticles film for cultural heritage: Conservation and consolidation of ceramic artifacts, Surface and Coatings Technology 271, 174-180, (2015).

Barberio, M., Veltri, S., Scisciò, M., Antici, P., Laser-Accelerated Proton Beams as Diagnostics for Cultural Heritage, Sci. Rep. 7, 40415 (2017), Nature (8 pages).

Bonnet, T., et al., Response functions of Fuji imaging plates to monoenergetic protons in the energy range 0.6-3.2 MeV, Rev Sci. Instrum., 84, 013508 (2013), (6 pages).

Borghesi, M. et al., Multi-MeV Proton Source Investigations in Ultraintense Laser-Foil Interactions, Phys. Rev. Lett. 92, 055003 (2004), vol . 92, No. 5(4 pages).

Clarke, E. L. et al., Energetic Heavy-Ion and Proton Generation from Ultraintense Laser-Plasma Interactions with Solids, Phys. Rev. Lett. (2000), vol. 85, No. 8; pp. 1654-1657.

Cowan, T. E. et al., Ultralow Emittance, Multi-MeV Proton Beams from a Laser Virtual-Cathode Plasma Accelerator, Phys. Rev. Lett 92, 204801 (2004), vol. 92, No. 20(4 pages).

Daido, H., Nishiuchi, M. and Pirozhkov, A. S., Review of laser-driven ion sources and their applications, Rep. Prog. Phys. 75, 056401 (2012), (71 pages).

Daw, M. S., Baskes, M. I., Embedded-atom method: Derivation and application to impurities, surfaces, and other defects in metals, Phys. Rev. B, 29, 6443 (1984), vol. 29, No. 12; pp. 6443-6453.

Daw, M. S., Baskes, M. I., Semiempirical Quantum Mechanical Calculation of Hydrogen Embrittlement in Metals. Phys. Rev. Lett., 50, 1285 (1983), vol. 50, No. 17; pp. 1285-1288.

Dromey, B., et al., Picosecond metrology of laser-driven proton bursts, Nature Comm. 7, 10642 (2016), (6 pages).

Dunne, M., Laser-Driven Particle Accelerators, Science, 374 (2006), vol. 312; pp. 374-376.

Editorial, Extreme light, Nature Materials 15, 1 doi:10.1038/nmat4533 (2016), 1 page, no author given.

Fuchs, J., et al., Laser-driven proton scaling laws and new paths towards energy increase, Nature Physics 2, 48 (2006), (7 pages).

Guduru, D., Niepel, M., Vogel, J., Groth, T., Nanostructured material surfaces—preparation, effect on cellular behavior, and potential biomedical applications: a review, Int J Artif Organs 34 (10): 963 (2011), pp. 963-985.

Higginson, D. P. et al., Temporal Narrowing of Neutrons Produced by High-Intensity Short-Pulse Lasers, Phys. Rev. Lett. 115, 054802 (2015), (5 pages).

www.nserc-crsng.gc.ca/Professors-Professeurs/RPP-PP/SPGTargetAreas-SPSDomainesCibles_eng.asp, Aug. 22, 2018, Jupiter.

www.rsc.org/periodic-table/element/79/gold, Aug. 22, 2018.

jlf.llnl.gov/, Aug. 22, 2018.

(56) References Cited

OTHER PUBLICATIONS physics.nist.gov/PhysRefData/Star/Text/PSTAR.html, Aug. 22, 2018, website for ion stopping power calculation; no calculations provided.

www.originlab.com/doc/Origin-Help/Gauss-FitFunc, Aug. 22, 2018.

Imbrogno, A., Pandiyan, R., Barberio, M., Macario, A., Bonanno, A., El Khakani, M.A., Pulsed-laser-ablation based nanodecoration of multi-wall-carbon nanotubes by Co—Ni nanoparticles for dye-sensitized solar cell counter electrode applications, Materials for Renewable and Sustainable Energy 6, 11 (2017), (10 pages).

Ju, M., Berman, A.T., Vapiwala, N., The Evolution of Proton Beam Therapy: Insights From Early Trials and Tribulations, International Journal of Radiation Oncology • Biology • Physics, 90, 733-735 (2014), vol. 90, No. 4.

Kempen, P. J. et al., A correlative optical microscopy and scanning electron microscopy approach to locating nanoparticles in brain tumors, Micron 68, 70-76 (2015).

Kim, Y. J., Cho, G., Song, G., Synthesis of size and shape-selective Au nanocrystals via proton beam irradiation, Nuclear Instruments and Methods in Physics Research B, 246, 351 (2006), pp. 351-354.

Ledingham, K. W., Bolton, P. R., Shikazono, N., and MA, C. M. C., Towards Laser Driven Hadron Cancer Radiotherapy: A Review of Progress, Applied Sciences 4 (3), 402 (2014), pp. 402-443.

Maksimchuk, A., Gu, S., Flippo, K., and Umstadter, D., Bychenkov, V. Y., Forward Ion Acceleration in Thin Films Driven by a High-Intensity Laser, Phys. Rev. Lett. 84, 4108 (2000), vol. 84, No. 18; pp. 4108-4111.

Mančić, A. et al., Isochoric heating of solids by laser-accelerated protons: Experimental characterization and self-consistent hydrodynamic modeling, High Energy Density Physics 6, 21 (2010), pp. 21-28.

Mančić, A. et al., Picosecond Short-Range Disordering in Isochorically Heated Aluminum at Solid Density, Physical Review Letters' PRL 104 035002 (2010), (4 pages).

Mančić, A., Fuchs, J., Antici, P., Gaillard, S. A., and Audebert, P., Absolute calibration of photostimulable image plate detectors used as (0.5-20 MeV) high-energy proton detectors, Rev. Sci. Intrum. 79, 073301 (2008), (6 pages).

Marinaro, G. et al., Networks of neuroblastoma cells on porous silicon substrates reveal a small world topology, Integrative Biology 7, 184-197 (2015).

Martyna, G., Tobias, D., and Klein, M., Constant pressure molecular dynamics algorithms, J. Chem. Phys., 101, 4177 (1994), pp. 4177-4189.

Palmer, R. E., et al., Nanostructured surfaces from size-selected clusters, Nature Materials 2, 443-448 (2003).

Parrinello, M., and Rahman, A., Polymorphic transitions in single crystals: A new molecular dynamics method, J. Appl. Phys., 52, 7182 (1981), vol. 52, No. 12; pp. 7182-7190.

Patel, P. K. et al., Isochoric Heating of Solid-Density Matter with an Ultrafast Proton Beam, Phys. Rev. Lett. 91, 125004 (2003), vol. 91 No. 12, 4 pages.

Plimpton. S., Fast Parallel Algorithms for Short-Range Molecular Dynamics, J. Comp. Phys., 117, 1-19 (1995); lammps.sandia.gov.

Powell, D., Europe sets sights on lasers, Nature 500, 7462 (2013), p. 264 (plus 1 page).

Robson, L., et al., Scaling of proton acceleration driven by petawatt-laser-plasma interactions, Nature Phys, 3, 58 (2007), vol. 3; pp. 58-62.

Romagnani, L. et al., Dynamics of electric fields driving laser acceleration of multi-MeV protons, Phys. Rev. Lett. 95, 195001 (2005), (4 pages).

\* cited by examiner

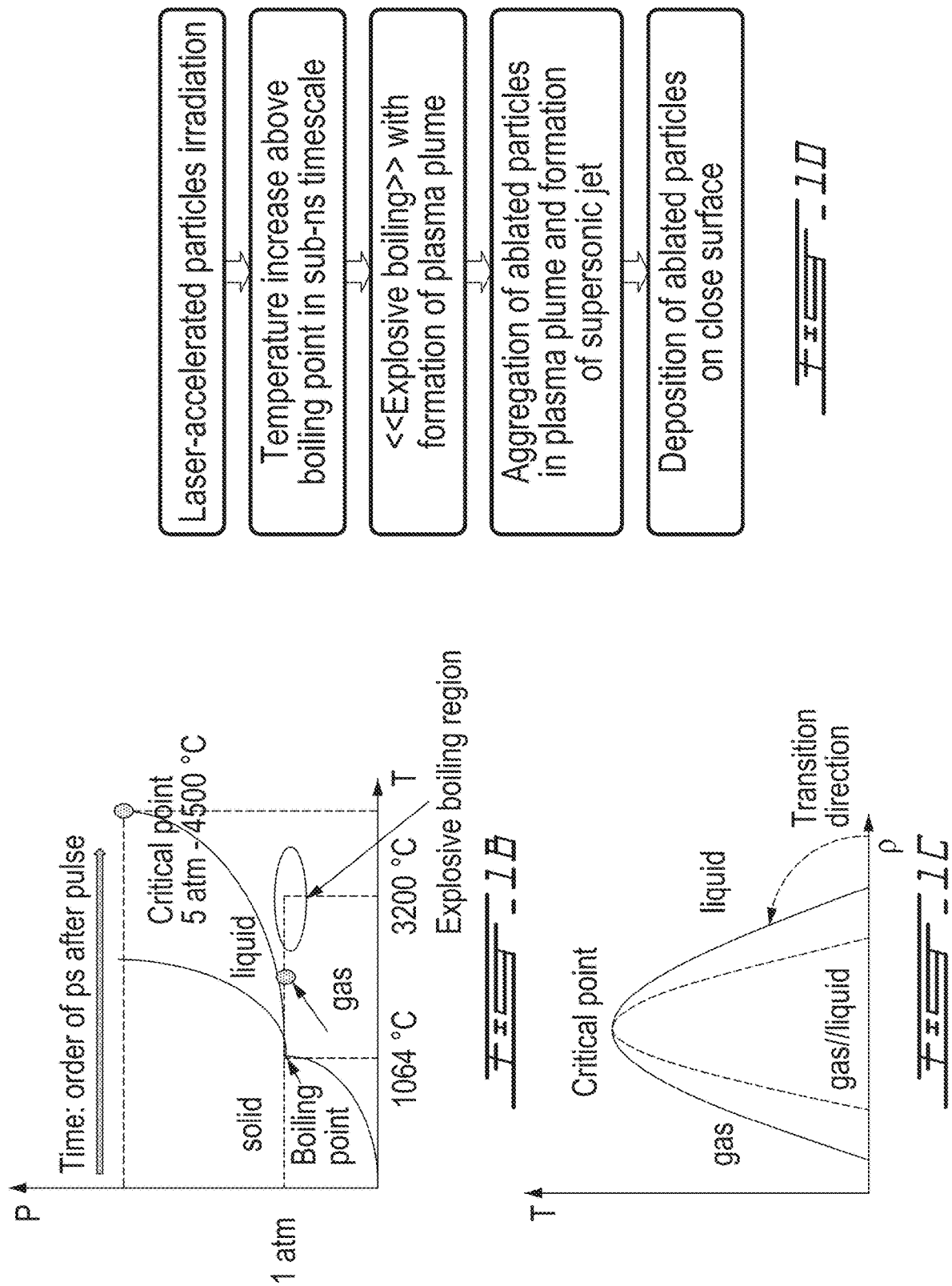

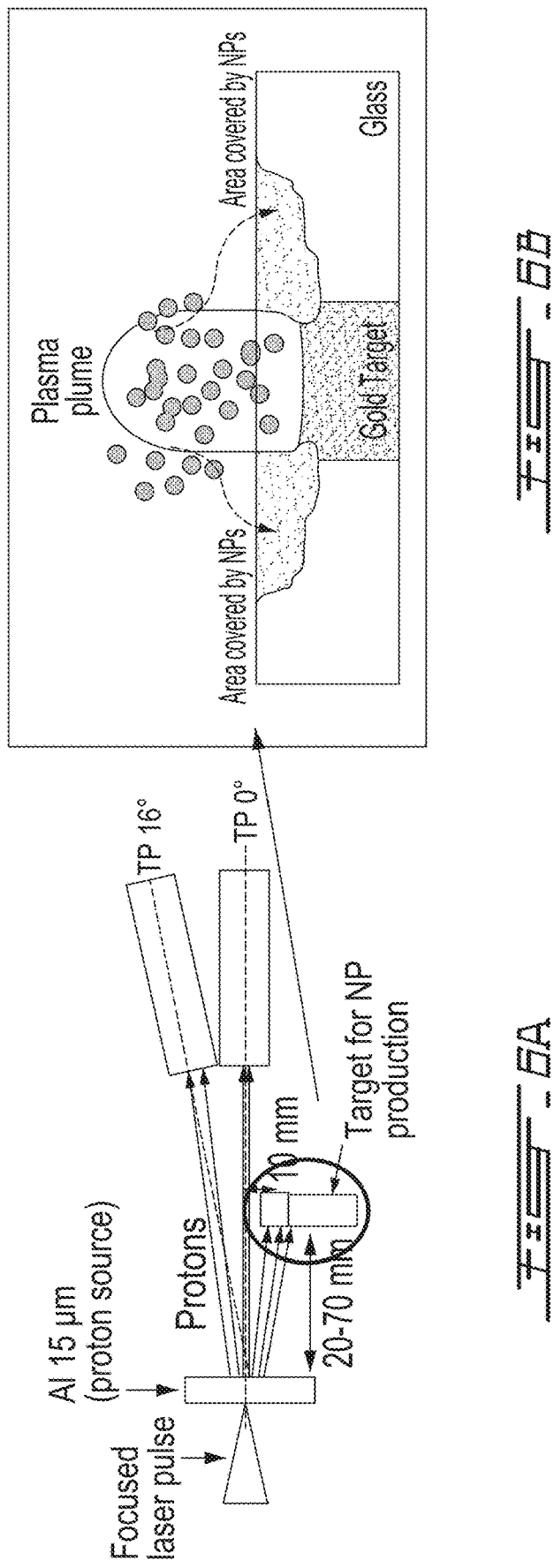

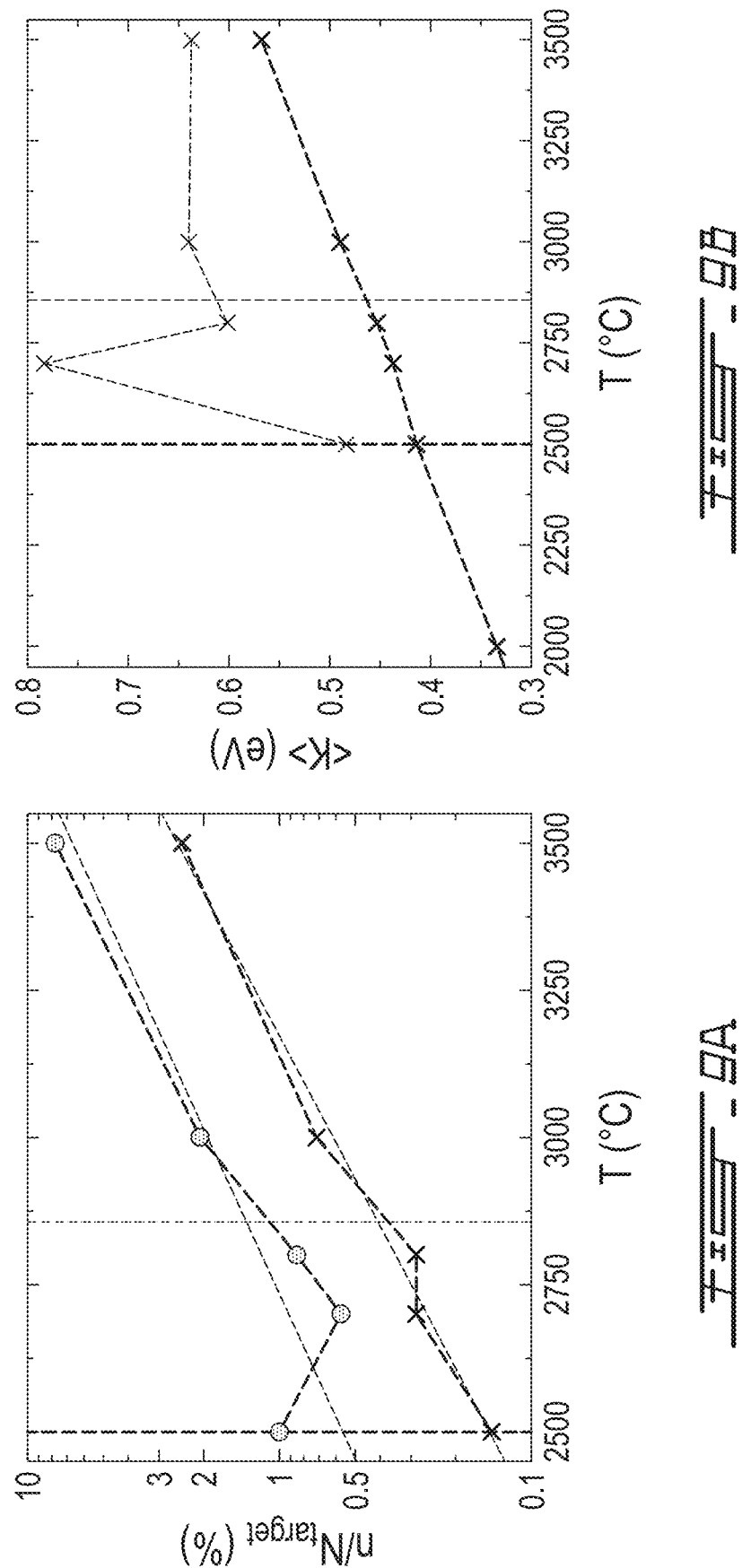

METHOD AND SYSTEM FOR FABRICATION OF CRYSTALS USING LASER-ACCELERATED PARTICLE BEAMS OR SECONDARY SOURCES

CROSS REFERENCE TO RELATED APPLICATIONS

This application claims benefit of U.S. provisional application Ser. No. 62/550,910, filed on Aug. 28, 2017. All documents above are incorporated herein in their entirety by reference.

FIELD OF THE INVENTION

The present invention relates to crystals fabrication. More specifically, the present invention is concerned with a system and a method for fabrication of crystals using laser-accelerated particle beams or secondary sources.

BACKGROUND OF THE INVENTION

The field of laser-accelerated proton beams, produced during the interaction of a target with a high-intensity ($I>1\times10^{18}$ W/cm$^2$), short pulse (<1 ps) laser, is a domain of increasing attractiveness in particular for the unique properties that these beams feature. In relation to acceleration of protons, typical proton beams that can be routinely obtained on high-power lasers exhibit about $10^{13}$ particles per shot, are ps duration at the source, have an energy in the tens of MeV and very good laminarity[7]. While strong effort is put to materialize different applications such as in fusion, radiography, astrophysics, neutron production, medicine, cultural heritage, or novel particle injector, material science applications are still in a very embryonic state while a strong claim is made to explore this new field of endeavor. Some of the unique characteristics of laser-driven protons, in particular short-duration and high flux, have the potential of improving many conventional applications where these parameters are important and represent a bottleneck. In material science, one potential field facing strong challenges is in the synthesis and growth of nano/micro-crystals and structured surfaces: Empirical procedures have been developed for the preparation of a wide range of semiconductor, ceramic, and metallic nano- and microcrystals, where the methods as well as growth parameters are often very specific to a single research group. Presently, achieving fine control over the monodispersity, structure, composition and defects of micro/nanoparticles is still a major challenge in micro and nanotechnology and is tackled by many research groups since considered strategically important for manifold applications. The ability to generate nano- and microstructures with a high-precision technique allows improving applications in several fields. In medicine, particles with dimensions ranging from sub-ten nm up to a few tens of nm can be used for enhancing imaging techniques such as Raman spectroscopy and magnetic resonance. However, the high-precision manufacturing of these particles, solvent-free, is still challenging, and new techniques for developing them are strongly in demand. Particularly in the biomedical field, higher-quality results can easily justify more expensive techniques when it comes to overcome a critical problem that cannot be solved differently (an example is the proton therapy, very expensive tumor treatment, yet unique for curing particular types of tumors.

However, the quest for high-precision crystals is not only made in biomedical applications. Micro- and nanoparticles influence the hydrophobic and optical properties of biological, and architectonical devices, additionally, it has been demonstrated that nanostructured materials used in photovoltaic applications can alter the electrical cells' properties and increase the efficiency of photovoltaic devices. The main problem in the definition of a standard growth protocol for these nano- or microcrystals is identifying the parameters to generate the conditions of temperature and pressure that are required to produce well-defined structures in very short temporal range (ps-ns). These short timescales are necessary for the nucleation of particles with dimensions of up to a nm, where conventional techniques currently lack in precise manufacturing techniques. A way to achieve this is the irradiation of matter by an energetic proton beam with short duration. The irradiation of a bulk target by high-energetic short-pulse protons, such as generated by interaction of a high-power laser with a solid target, can generate the temperature and pressure conditions required to grow crystalline structures.

There is still a need in the art for a method and system for fabrication of crystals.

SUMMARY OF THE DISCLOSURE

More specifically, in accordance with the present disclosure, there is provided a method for fabrication of crystals, comprising heating an irradiation target to a temperature comprised in a range between a boiling point temperature of a material of the irradiation target and a critical point temperature of the material of the irradiation target, thereby generating a plasma plume of particles ablated from a surface of the irradiation target.

There is further provided a system for fabricating crystals, comprising a source of an irradiating beam and a first target, a beam from the source irradiating a surface of the first target and heating the surface to a temperature comprised in a range between a boiling point temperature of a material of the first target and a critical point temperature of the material of the first target, thereby generating a plasma plume of particles ablated from the surface of the first target.

Other objects, advantages and characteristics of the present disclosure will become more apparent upon reading of the following non-restrictive description of specific embodiments thereof, given by way of example only with reference to the accompanying drawings.

BRIEF DESCRIPTION OF THE DRAWINGS

In the appended drawings:

FIG. 1B is a pressure versus temperature thermodynamic graph of crystal formation by laser-driven particle ablation of gold;

FIG. 1C is a temperature versus pressure thermodynamic graph of crystal formation by laser-driven particle ablation;

FIG. 1D is a flowchart of a method for crystal formation by laser-driven particle ablation according to an embodiment of an aspect of the present disclosure;

FIG. 6A shows a system for laser-accelerated protons according to an embodiment of an aspect of the present disclosure;

FIG. 6B is a close-up view of the target of FIG. 6A;

FIG. 9A shows the fraction (n/Ntarget) of detached atoms from the surface (with z≥50 Å) at the time t1 (crosses) and at the time t2 (circles) versus temperature (T) of the target zone; dashed bold vertical line referring to the lower T for the detachment of gold atoms; dashed light vertical line referring to the boiling temperature of gold;

FIG. 9B shows mean values of the kinetic energy <K> of atoms in the two zones of the simulation cell as described in FIG. 9A, versus temperature (T) of the target zone.

DESCRIPTION OF ILLUSTRATIVE EMBODIMENTS

Figure 1A:
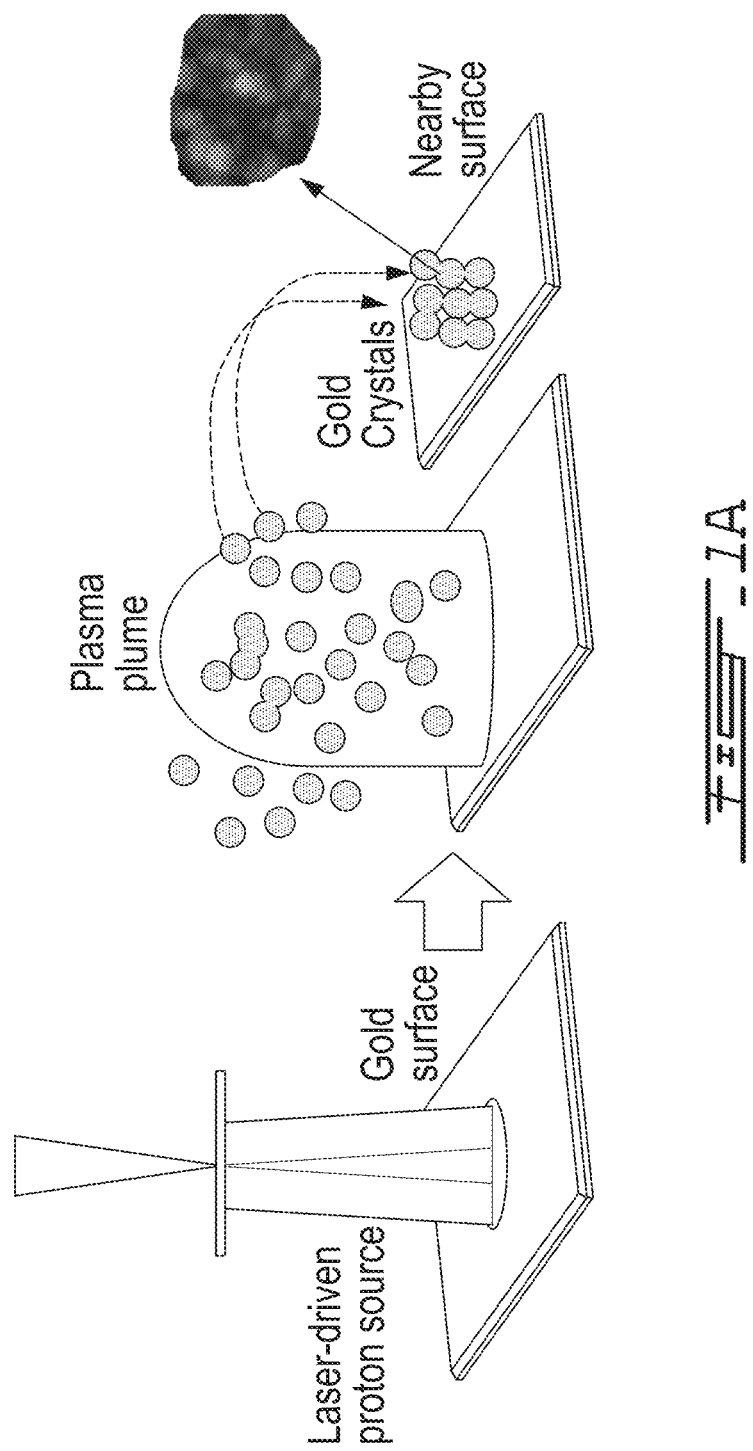
FIG. 1A is a schematic diagram of crystal formation by laser-driven particle ablation, in the case of laser-accelerated protons.

The present invention is illustrated in further details by the following non-limiting examples.

In a nutshell, crystals and structured surfaces are fabricated using laser-accelerated particles, by ablation of a target material using a laser-accelerated particle beam or a beam from a secondary source such as electrons, neutrons and X-rays for example. The surface of an irradiation solid target of a material having a low melting temperature is irradiated with very short laser-accelerated particles to achieve thermodynamic conditions between the boiling and the critical point of the irradiation target material. The intense and very quick, in the ns range, energy deposition by the laser-accelerated particles on the irradiation target induces an explosive boiling and produces micro- and nano-crystals that nucleate in a plasma plume composed by ions and atoms detached from the laser-irradiated surface of the irradiation target. These particles synthesized in the plasma plume may then deposit on a neighboring, non-irradiated, deposition target surface.

Depending on the laser and the accelerated particle flux, material having a melting temperature up to a few thousand, for example of at most 4000° C., such as silver (melting temperature of 962° C.), gold (melting temperature of 1064° C.) or aluminum (melting temperature of 660° C.) for example, may be used as the irradiation target. The laser-accelerated particles beams have a short duration, in the range between ps and ns at the source, for example comprised in the range between about 10 ps and 50 ns.

A method according to an embodiment of an aspect of the present disclosure was tested by depositing low-melting-material such as gold onto nearby silver surfaces and modeling a corresponding proton/matter interaction. Morphological and crystallinity analysis indicated the formation of gold octahedral crystals with dimensions of about 1.2 μm uniformly distributed onto silver surfaces of dimensions in the tens of mm$^2$.

According to an embodiment of an aspect of the present disclosure, a method comprises ablating the surface of a solid irradiation target of a material having a low melting temperature by irradiation with a high-energy short-pulse laser-accelerated particle beam. Compared to conventional ablation methods, in the present method the irradiation target surface is intensively irradiated for at most a few ns, for a duration comprised between about 2 and 5 ns for example, reaching thermodynamic conditions that are between the boiling and the critical point of the material of the irradiation target. High-energy proton beams may be generated by target normal sheath acceleration (TNSA) occurring when a high-intensity (I>10$^{18}$ W/cm$^2$), short-pulse (duration <1 ps) laser hits a target with micrometric thickness under vacuum. Such laser-accelerated proton beam used to irradiate the irradiation target generate in the bulk of the irradiation target temperature and pressure conditions that are unreachable in conventional nanomaterial laboratories using industrially produced ion beams and that favor the nucleation of crystals with a control in crystallinity and dimensions. The interaction between the laser-accelerated proton beam and the low-boiling material of the irradiation target causes detachment of atoms and ions from the irradiation target surface yielding particles with very high mean energy within a plasma plume. These particles may then deposit on nearby cold solid surfaces of deposition targets.

Laser-driven particle beam ablation, as schematically illustrated in FIGS. 1A-1B, comprises interaction between a high-energy particle beam and an irradiation target, heating up of the irradiation target and expansion of a plasma plume and cooling down of the irradiation target.

The interaction between the high-energy particle beam and the irradiation target occurs in a ps-ns depending on the distance, for example between about 1 and 5 ns.

The heating up of the irradiation target occurs in a few hundreds of ps, typically between about 500 ps and 1000 ps, to temperatures ranging between the boiling and the critical point as shown in the pressure-temperature phase diagram in FIG. 1B. The penetration depth of the impinging particles, in the present case protons with a maximum energy in the range between about 20 and 30 MeV, is in the order of tens of microns and allows for an in-depth heating of the irradiated target up to this distance.

In the plasma plume generated by the laser-accelerated protons, the ablated materials, including for example atoms, ions and nanoclusters, nucleate, form crystals that may deposit onto surfaces reached by the plasma plume (see FIG. 1A).

The detachment of the atoms and ions from the irradiation target surface starts with the interaction between the laser-accelerated particles and the bulk material of the irradiation target and lasts over a timespan up to the tens of ns, typically lower than 100 ns. This is longer than the particle beam irradiation (in the present case, the heating process lasts a few ns, considering proton energies that mostly contribute to the heating of the surface of the target) since it takes time to transfer the thermal energy deposited by the particles. The short plume duration generated by the laser-accelerated particles limits the nucleation time to the range of ns depending on the distance, for example between about 1 ns and 10 ns, causing the stop of nucleation in the phase where atoms arrange in crystals or nanoparticles without aggregation of amorphous structures. The nucleation of a nanoparticle in a hot plasma starts in the first ps of the plume formation and continues until the plume cooling phase has finished, when the surface temperature has dropped below the boiling point and the deposition on a deposition target surface has occurred. As reported hereinbelow in relation to numerical simulations, in the present example the plume has durations of tens of ns and the micrometric dimensions of obtained gold crystals are typical of a cooling phase of about 100 ns. Despite this longer cooling phase, the elapsed time is still sufficiently short to prevent reaching the condensation phase, which takes place over a time span longer than hundreds of ns; additionally, the quick cooling avoids the formation of larger and amorphous particles in the plume. Given the stringent temperature conditions, the proton-induced heating occurs only in the region that almost corresponds to the spot irradiated by the proton beam, in an area in the range of $mm^2$. Since the proton heating duration dictates the crystal generation, any variation of the interaction conditions between the laser-accelerated proton beam and the irradiated surface that results in a modification of the heating time, such as changing the number of protons per unit of irradiated surface, varying the distance between the particle source and the irradiated surface or tuning the length of the laser pulse for achieving different irradiation times of the surface the number of protons, the speed of the protons, the fluence and flux on the surface, is found to impact the characteristics and properties of the generated crystals.

Figures 6C, 6D:
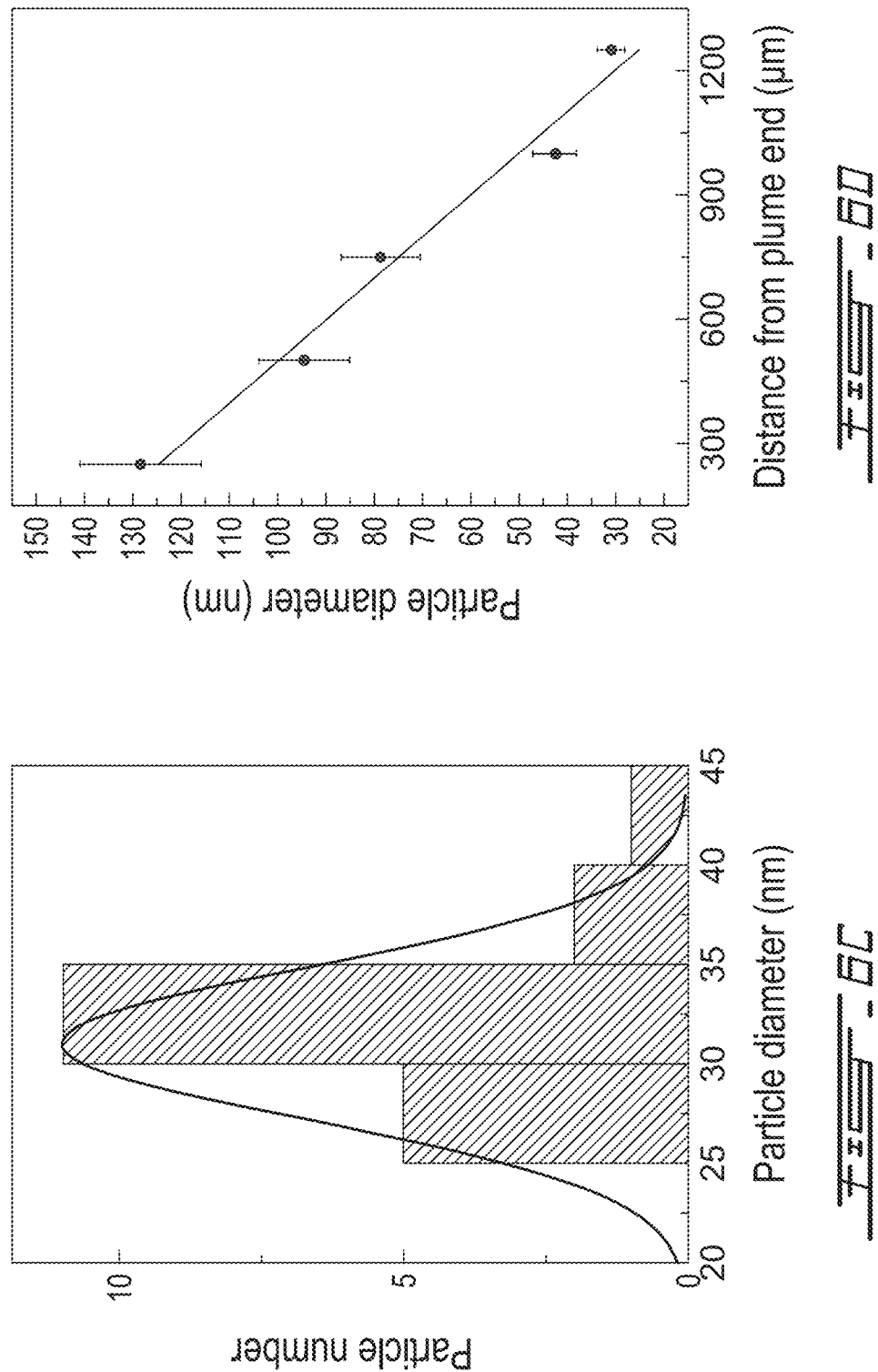
FIG. 6C shows size distribution of nanoparticle sizes.
FIG. 6D shows particle diameter versus distance from the plume end.

Thus, selecting and adjusting these parameters allows tailoring the characteristics of the structure of the obtained particles and, with appropriate tuning, allows for generating structures reaching dimensions in the nanometer scale as will be described hereinbelow in relation to FIG. 6 for example. The generated nano- or micro-particles can be easily detached from the deposition target surfaces, for example by performing a sonication of a few minutes in a polar solvent bath, for mixing them into a colloidal solution.

Ablation may be simulated in a first approximation using a classical thermodynamic model, considering three thermal processes leading to material removal from a proton-irradiated target: vaporization, normal boiling and explosive boiling. In the case of high-energy, short-pulse proton beams, the explosive boiling can be considered as being the main mechanism in the formation of ablated particles. It occurs when solid matter is rapidly, in a timeframe in the order of ps-ns, superheated to temperatures higher than the boiling point thereof. In these conditions a spinal decomposition takes place in the vapor and liquid phase, accompanied by a homogenous nucleation. The thermodynamic evolution of the irradiated target, going from solid to explosive boiling, can be described using a temperature-density phase diagram as shown in the FIG. 1C: the fast heating and concomitant density drop leads the system to the region of spinodal decomposition where explosive boiling occurs. In FIG. 1C, the evolution of the system is indicated in dotted line. The plasma plume is confined to the region where the temperature is higher than the boiling point. Different physical phenomena occur on the material surface from where the plume is generated: the surface of the irradiated area melts during the heating timeframe and the solid lattice of the material is destroyed. During the cooling phase the atoms on the surface rearrange their position, forming uncontrolled structures such as amorphous aggregation, micro- and nanoparticles. These aggregation characteristics can be very different from case to case and strongly depend on the temperature and on the duration of the cooling phase. Experimental results indicate a complete melting of a gold irradiation target surface, which after irradiation appears destroyed and covered by amorphous gold droplets as described hereinbelow.

Experiments were performed on the TITAN laser of the Jupiter Laser facility (Laurence Livermore National Laboratory—LLNL), with laser pulses of about 220 J in 700 fs at a wavelength of 1.053 μm. The laser-accelerated protons were made to impinge a commercially available solid gold target with dimensions of 5×15 mm and of thickness 100 μm located at a distance of 2.5 cm from the proton source. Two silver deposition targets of dimensions 2.5×10 mm were placed at both sides of the gold irradiation target in order to catch all the nanoparticles generated by the gold target in the plasma plume (see FIGS. 5A, 5B). A first silver deposition target was in direct contact with the gold target at a first side of the gold target and a second silver target was located at a distance of 4 mm on the second side of the gold target (see FIG. 5B).

Figures 2A, 2B:
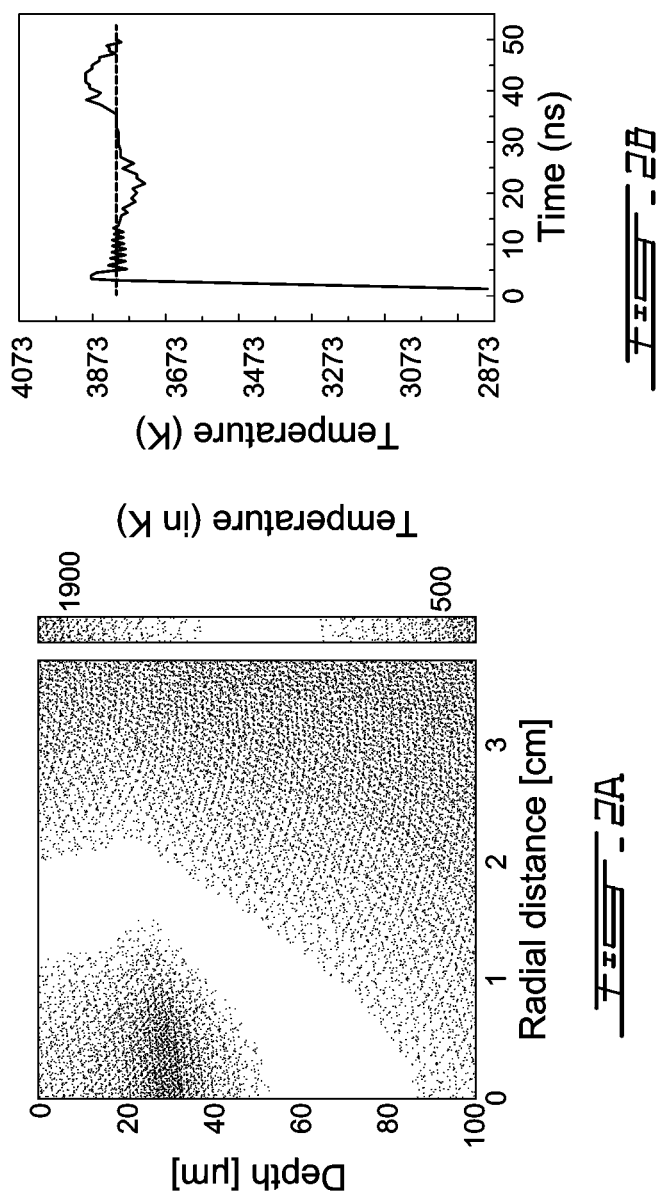
FIG. 2A shows a computed temperature map of a gold target about 900 ps after irradiation; the target being located at 2.5 cm from a proton source; the 0-level indicating the surface of the target in front of the proton beam.
FIG. 2B shows temperature evolution in time, monitored on the target surface; the temperature being computed in the warmer region at a penetration depth of 40 μm and at a radial position of nearly beam center.
Figure 2D:
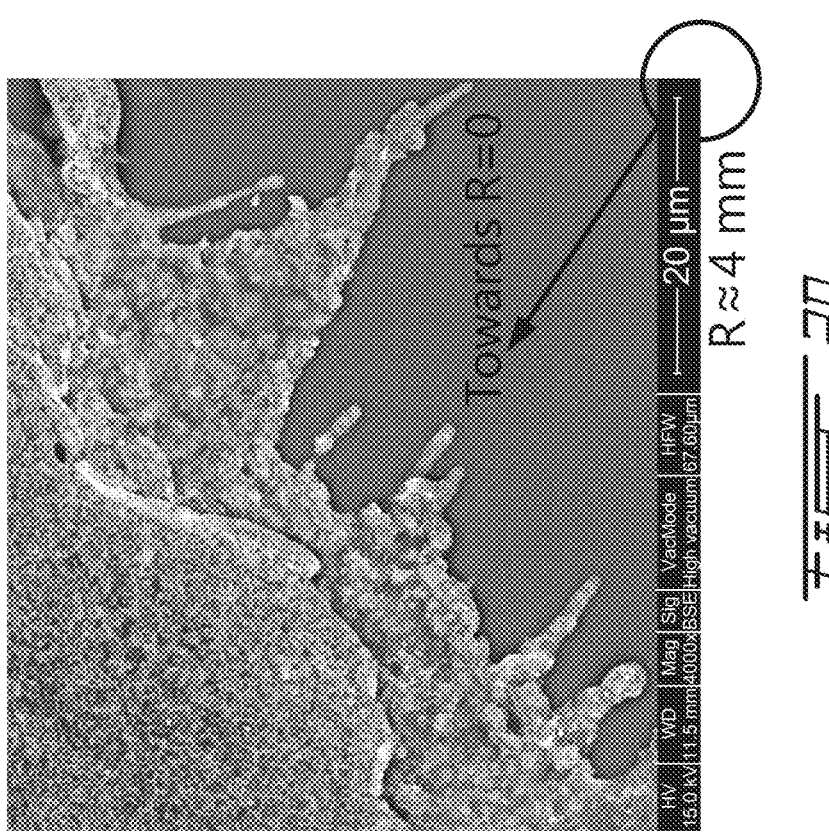
FIG. 2D is SEM image of the gold target of FIG. 2C at a beam distance of 4 mm as indicated with a circle, the beam center direction being indicated with an arrow.
Figure 2C:
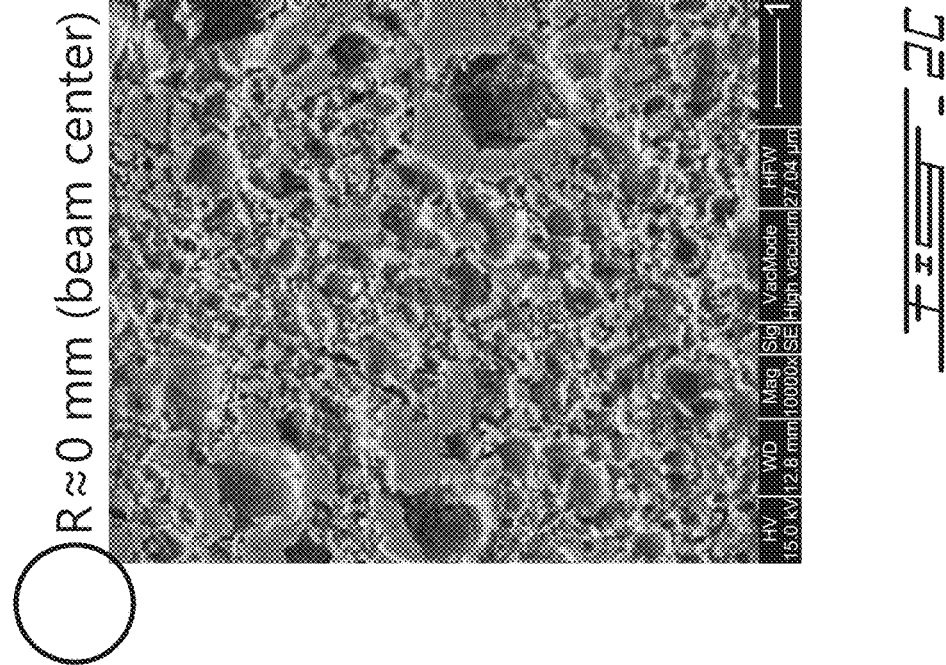
FIG. 2C is a SEM image of a gold target irradiated by laser-accelerated protons, taken near the beam indicated with a circle.

Simulations were conducted with the above-mentioned laser and proton parameters. The proton-target interaction was modeled with a Monte Carlo code, in which the laser-accelerated proton beam obtained on the TITAN laser was used as the heating source. FIG. 2A shows a computed temperature map obtained for a 100 μm thick monocrystalline gold foil irradiated by the laser-accelerated proton beam obtained on the TITAN laser, showing the change in temperature in relation to a radial distance from the proton beam center (x-axis) and in relation to the depth in micrometers (y axis) within the target from the surface of the target to 100 micrometers deep within the target; the scale bar on the right handside of FIG. 2A indicates the temperature (in K) within the sample. The temperature map was collected earlier than 1 ns after irradiation and for a target located at a distance of 2.5 cm from the source. The computed temperature map (FIG. 2A) indicates that the bulk irradiation target heats up to temperatures higher than the boiling point in almost the entire region covered by the proton beam, in an area with a radius of 4 mm and depth of 80 µm. From the simulations it is also shown that the plasma pressure stays constantly below 500 kPa in the entire irradiation target bulk, which is below thermodynamics critical conditions for gold, which are 4800 K (4500° C.) at 500 kPa (5 atm). The density is almost constant all over the gold target and is comprised between 18.5 and 19.1 g/cm$^3$ in the entire region covered by proton beam. These values are lower than the gold solid state (19.33 g/cm$^3$). Numerical results shown in FIG. 2A show that the gold target irradiated by the laser-accelerated proton beam reached the thermodynamic conditions for explosive boiling (temperature of 3200° C. at 1 atm), as confirmed by SEM images in FIGS. 2C, 2D, which show the melted surface of the gold target at the beam center (R=0 mm) and up to a radial distance of R about 4 mm. The above-mentioned findings strengthen the predicted evolution of the system consisting of the irradiated target as foreseen (dotted line in FIG. 1C).

FIG. 2B shows temperature evolution in time, monitored on the gold target surface. The temperature was computed in the warmer region at a penetration depth of 40 µm and at a radial position of nearly beam center. The maximum temperature shown in FIG. 2A does not correspond to the maximum temperature as found in FIG. 2B since in FIG. 2A the gold target temperature was still in the onset phase; in FIG. 2B, after the onset, the temperature stays above the boiling point for tens of ns, ensuring the duration of the plume; the dashed line shows the mean value.

From the temperature/time profiles in FIG. 2B, it can be seen that the temperature in the warmer region stays constant above the boiling point (temperature of 3400K) for at least 50 ns after irradiation, which corresponds approximately to the duration of the gold plume. The ablation time of a few tens of ns therefore allows the formation of aggregates in the plume, with dimensions from few to tens of microns, due to erosion of gold from the irradiation target, and the deposition of gold particles on the surface of the nearby silver target.

Experimental results for the above-mentioned distance conditions between the proton source and the irradiated gold target between 2.3 cm to 2.7 cm are shown in FIG. 3. Scanning electron microscope (SEM) images before (see FIG. 3A) and after (FIG. 3B) irradiation respectively show significant erosion of the gold target, the surface being, after the proton irradiation, melted with craters having dimensions ranging from hundreds of nm to few µm, i.e. highly porous and rough (see FIG. 3B) as opposed to the initially smooth surface of the gold target (see FIG. 3A). The target morphology obtained after the irradiation (see FIG. 3B) is evidence of a large thermal shock and the formation of a fluid state after irradiation, in which gold atoms are free to move and rearrange in the matrix or can be ejected from the surface. The disordered arrangements of atoms on the surface and the complete absence of micro or nano-structuration on the gold target after the irradiation (see FIG. 3B) indicate a cooling time lasting longer than a few ns, in accordance with the theoretical previsions.

Figure 3B:
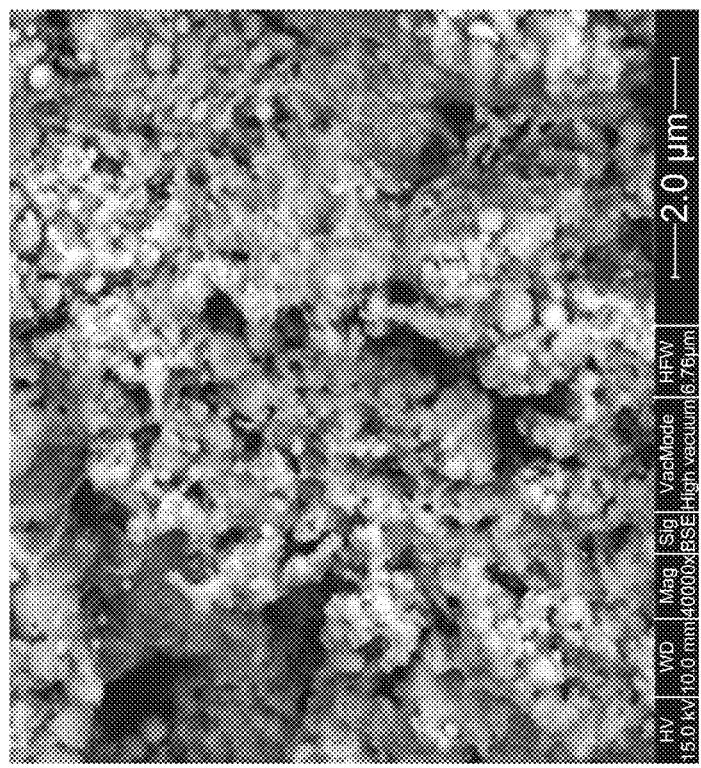
FIG. 3B is a SEM image of the silver target of FIG. 3A after irradiation.
Figure 3A:
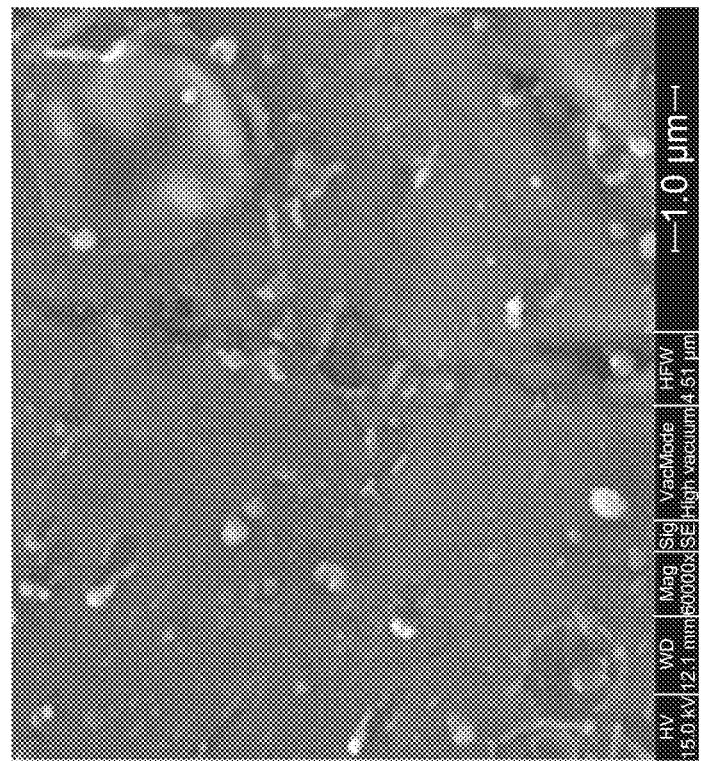
FIG. 3A is a SEM image of a silver target before irradiation.
Figure 3E:
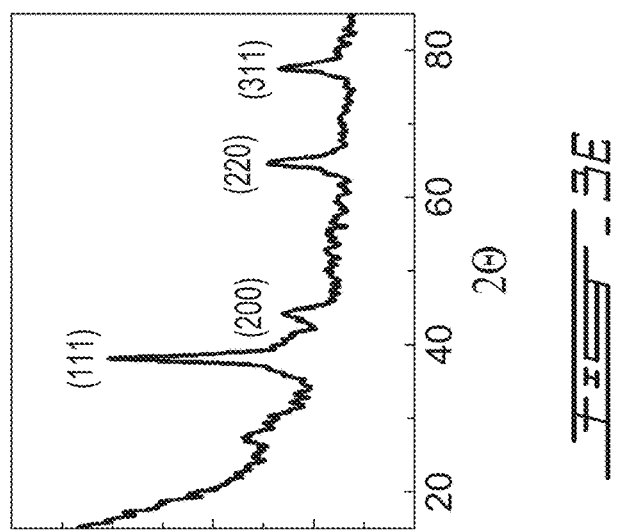
FIG. 3E is a X-ray diffraction (XRD) graph of the silver deposition target surface.
Figure 3D:
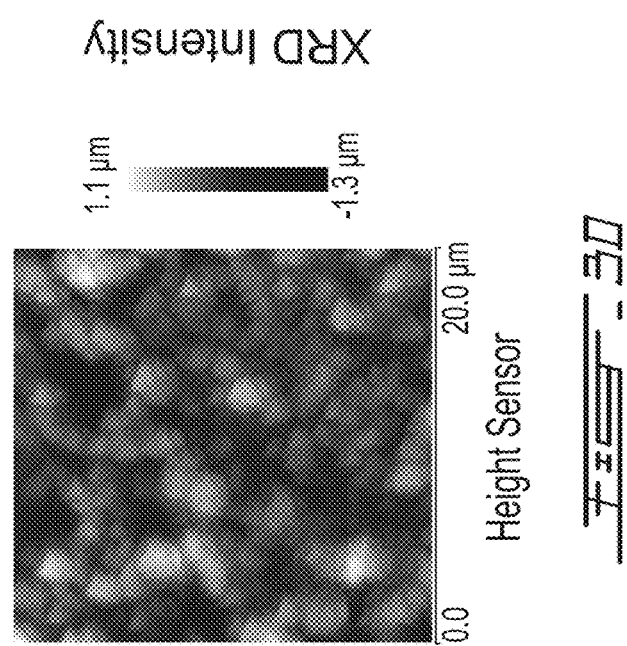
FIG. 3D is an AFM image of gold microcrystals deposited onto the silver substrate.
Figure 3C:
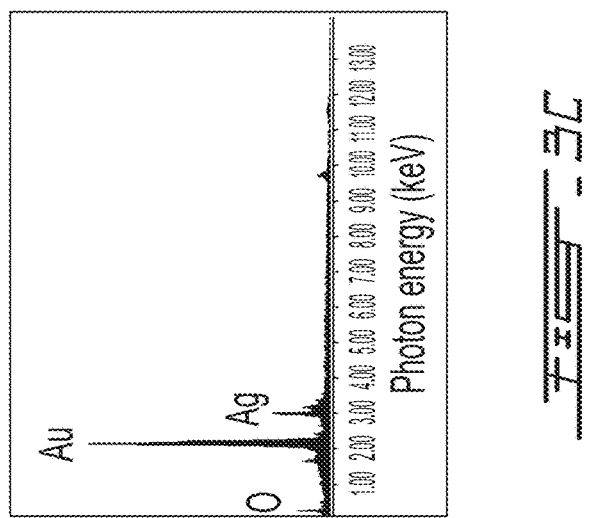
FIG. 3C is an EDX graph of the silver target of FIG. 3A after irradiation.
Figure 4C:
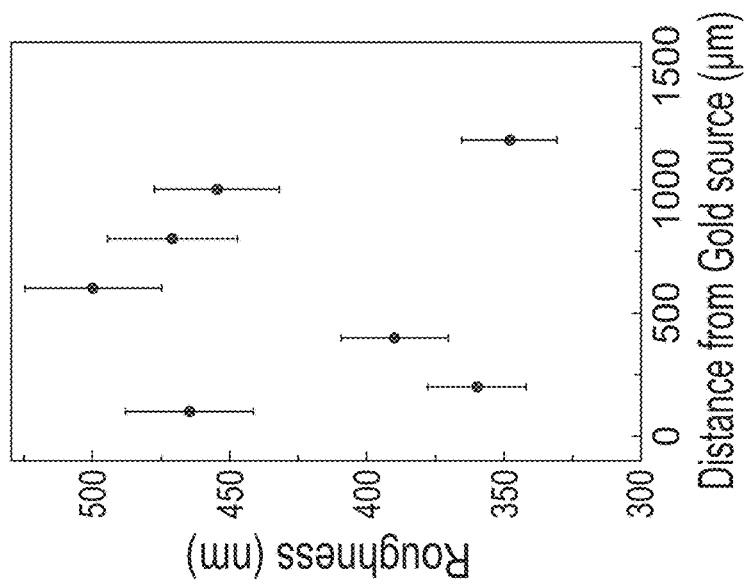
FIG. 4C shows surface roughness of gold microcrystals deposited onto the silver substrate evaluated from AFM images.
Figure 4B:
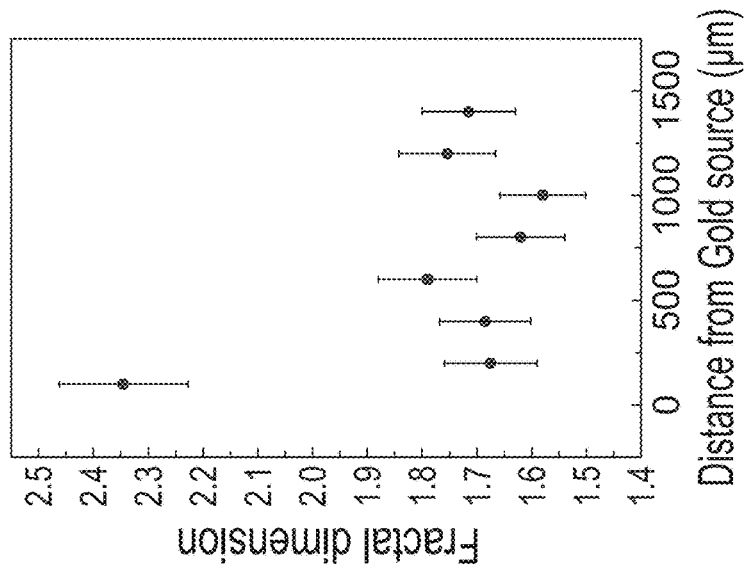
FIG. 4B shows fractal dimensions of gold microcrystals deposited onto the silver substrate evaluated from AFM images.
Figure 4A:
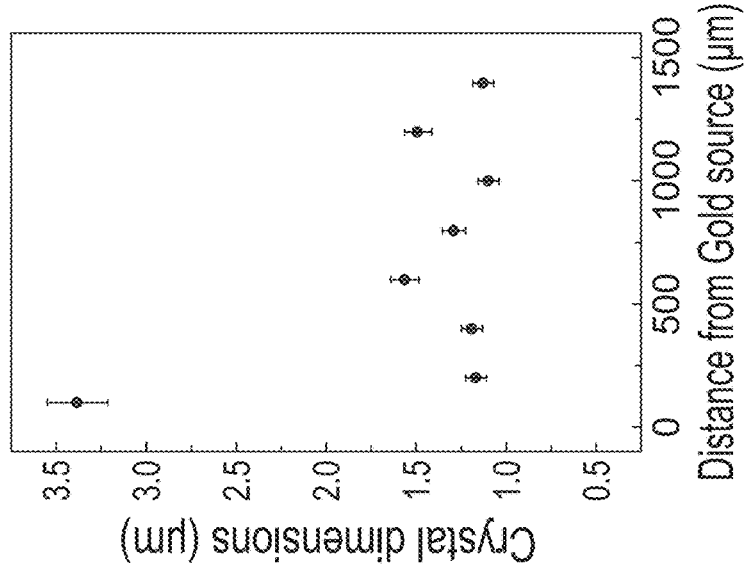
FIG. 4A shows crystal dimensions of gold microcrystals deposited onto the silver substrate evaluated from AFM images.

Atomic Force Microscope (AFM) images (FIG. 3D) taken from the silver deposition target surface located close to the irradiated gold target show the formation of a microstructure composed by triangular particles with dimensions of about 1 µm (see FIG. 4A). The mean size of the microstructures depends on the distance from the gold source and, for distances in the range between about 200 µm and about 1500 µm, are comprised in the range between about 1.2 µm and about 1.5 µm. However, within a more restricted area of 5×5 µm (area of the AFM), the precision of the mean size increases, reaching variances around the mean value of about 5% as computed by the AFM software. X-ray diffraction (XRD) data in FIG. 3E show the presence of gold octahedral crystals with triangular faces (observed by the AFM tip) with orientation (111), (200), (220), and (311). The crystallite sizes for each mono-crystal visible in the XRD data, when using the Scherrer equation with a K factor of 0.9, an X-ray wavelength equivalent to the Cu Kα the line broadening and Bragg angle for each band evaluated using a Gaussian fit obtained with the data analysis software (Origin 8.0), are all in the range of a few nm, varying from about 2 nm for the (101) up to 9.24 nm for the (111) line. The microcrystals visible in the AFM images are consequently an aggregation of small crystals obtained in the plume.

Energy Dispersive X-ray Analysis (EDX) measurements taken on the micro-structured surface of the silver target (FIG. 3C) show a bulk composition consisting in a thick layer of gold micro-particles deposited on the silver surface. The high gold percentage (60% with respect to 30% of silver, the remaining 10% being oxygen) confirms that the triangular structures detected on the silver surface are composed by gold atoms. Analysis of the micro-particle morphology in different locations for different distances between the gold irradiation and silver deposition targets shows the formation of a microstructure with constant dimensions (FIG. 4A), fractal dimension (FIG. 4B) and roughness (FIG. 4C), on the silver deposition surface, indicating a uniform distribution of particles nucleated in the plasma plume, particles that cover on the silver targets a surface of about 4×6 mm. Thus, the present method allows generating, with a single sub-ns laser shot, micro-structured particles over surfaces measuring several tens of mm$^2$.

The obtained structures have a pure chemical composition without presence of impurities, and a regular distribution of particles in terms of shape and dimensions, similarly to what can be obtained with conventional methods, such as laser ablation in solution (LASIS). Differently from LASIS or PLD, in which the time required to fabricate the structures is in the range of tens of minutes and the process requires in-situ or ex-situ control methods, the present method is quick and precise. Moreover, the present method allows controlling a-priori the particle dimensions by selecting irradiating particles parameters such as the distance between the particle source and the irradiation target, the duration of the irradiating particle beam, and the driving laser's power. In contrast, with classical laser-based methods such as LASIS or PLD, the control over the fabricated structures is only achievable a-posteriori, after microscope analysis, or in real time, using UV-plasmonic spectroscopy.

Figure 4E:
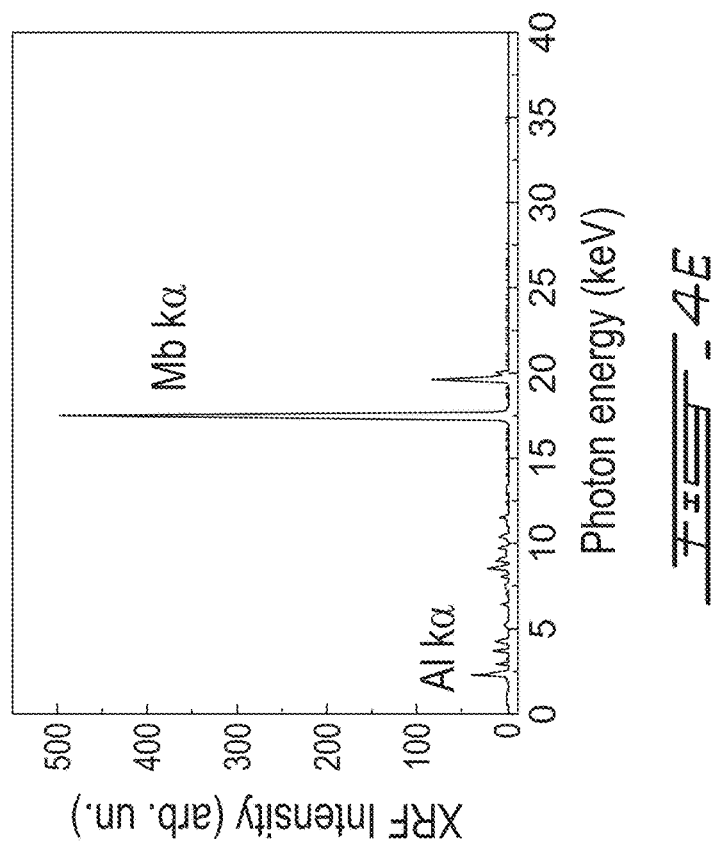
FIG. 4E is a XRF spectrum of aluminum microcrystals deposited onto the molybdenum substrate.
Figure 4D:
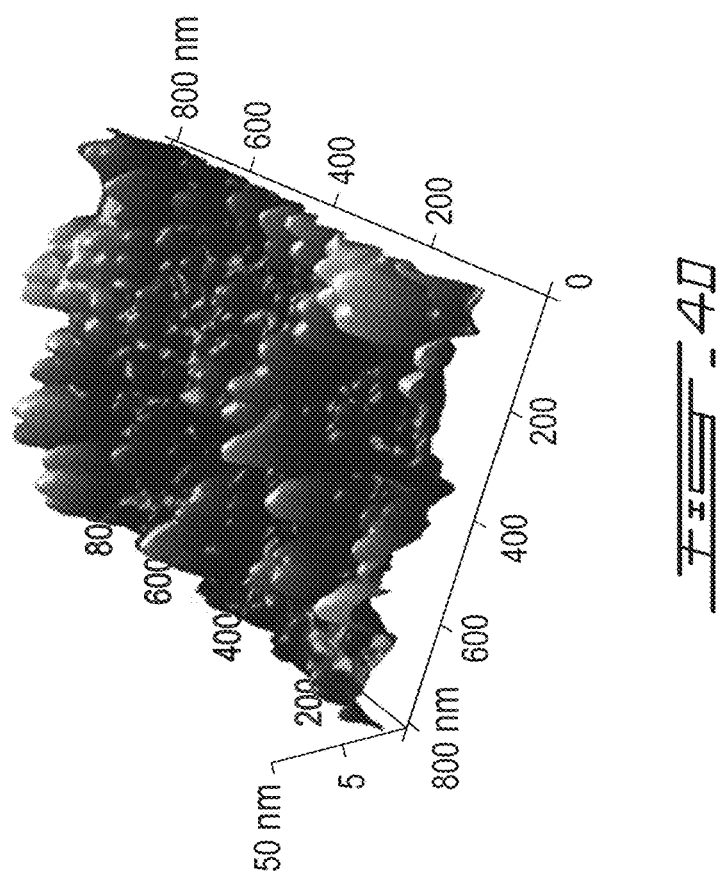
FIG. 4D is an AFM image of aluminum microcrystals deposited onto a molybdenum substrate.

The experiments were repeated irradiating an aluminum (90% purity) irradiation target located at 2.5 cm from the proton source, and depositing aluminum particles onto a molybdenum deposition target. Hydro-dynamical simulations indicate a temperature of about 1750° C. for the aluminum irradiation target surface, while morphological and chemical analysis, illustrated in FIGS. 4D-4E, show the deposition, on the molybdenum deposition target surface, of a nanostructure composed by hemispherical particles with dimensions of the order of 150 nm. Thus, as in experiments with a gold irradiation target and deposition silver target as described hereinabove, nanostructured surfaces may be grown by tuning the irradiation conditions.

There is thus provided a laser-driven particle beam ablation method for the micro-structuration of surface materials. Experiments using a laser-driven proton beam impinging a gold irradiation target showed the formation of crystalline gold microstructures on a surface of a silver deposition target positioned at a distance comprised in the range between about 0 mm and about 1.4 mm from the gold irradiation target. The microstructure is composed of octagonal crystals, with uniform dimension of about 1.2 µm, high precision and density in an area of about 24 mm$^2$ covered by the plasma plume. Experimental findings were confirmed by Monte Carlo simulations, which show that the laser-accelerated proton beam reproduces ideal conditions for a controlled growth of microcrystals. In the irradiated gold bulk, it was possible to reproduce temperature, density, and pressure conditions typical for explosive boiling. The material detachment from the bulk surface, followed by the formation and expansion of a plasma plume, generate the nucleation and aggregation of gold crystals and their deposition onto the deposition targets.

For fabricating nano-crystals, the plasma-generating heating process is made shorter so as to achieve less intense heating on the material surface, but still to achieve above boiling conditions This can be obtained for example by lowering the proton dose or increasing the distance between the proton source and the plasma plume generating target. For example, FIG. 6 show that depending on the distance between the proton source and the plasma plume generating target, nanocrystals with variable size ranging from a few hundreds to tens of nm can be obtained.

Figure 5A:
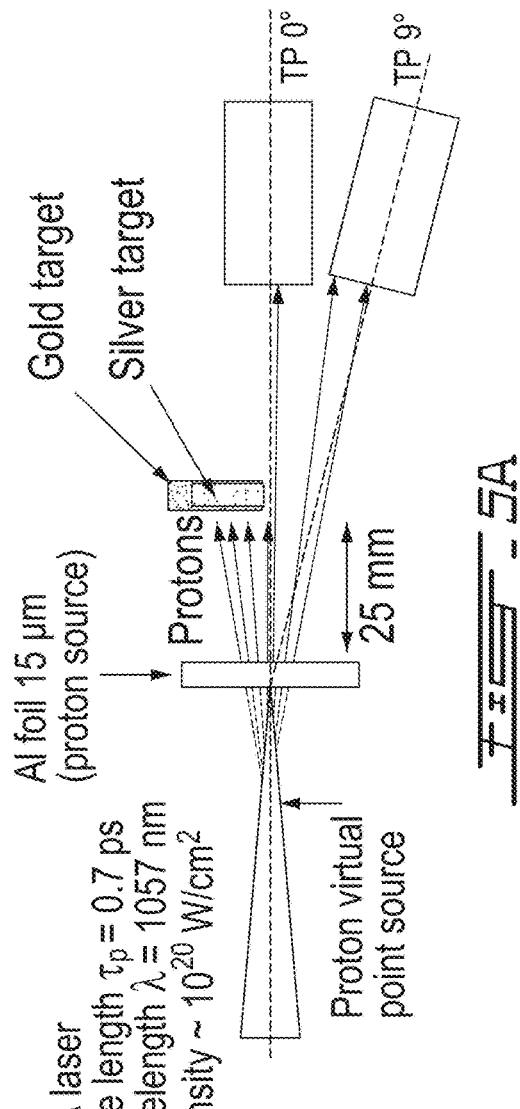
FIG. 5A shows a system according to an embodiment of an aspect of the present disclosure.

An experimental set-up is shown in FIG. 5A laser with energy E=220 J, pulse duration $\tau$=700 fs, wavelength $\lambda$=1.057 µm, 8-10 µm focal spot diameter (FWHM), and intensity I of about $10^{20}$ W/cm$^2$ was used for interacting with an aluminum 15 µm target as a proton source in order to accelerate protons in the laser-forward direction using the TNSA mechanism. The Amplified Spontaneous Emission (ASE) has been measured to be <10-6 in contrast, i.e. delivering ~10 mg. in energy. The protons stemming out from the proton source target were impinged into an irradiation target of gold (gold 99.9% and 100 µm thickness manufactured by Goodfellow), which was placed on axis at a distance of 2.5 cm (FIG. 5A). Two silver deposition targets were positioned radially with variable distance from the gold irradiation target (see FIG. 5B).

Two calibrated Thomson parabolas (TPs) and spectrometers located at 0° (TP 0°) and 9° (TP 9°) with respect to the main pulse laser axis were used to measure the forward generated proton spectrum. The TPs were placed respectively at a distance of 690 and 565 mm from the proton source (distance to the entrance slit). Proton spectra measured by the TPs were readout in an absolute manner using Image Plates (BAS-TR 2025 from Fuji Photo Film Co. Ltd) that were analyzed using a FUJIFILM FLA-7000 reader. Additional measurements of the proton spectra were obtained using Radio Chromic Films (RCFs) of the type HS that allowed obtaining a beam spatial distribution. During the shots, the irradiation gold target was placed occupying only a first half of the proton beam so that the TP could readout the spectrum using the second half of the proton beam.

Figure 5C:
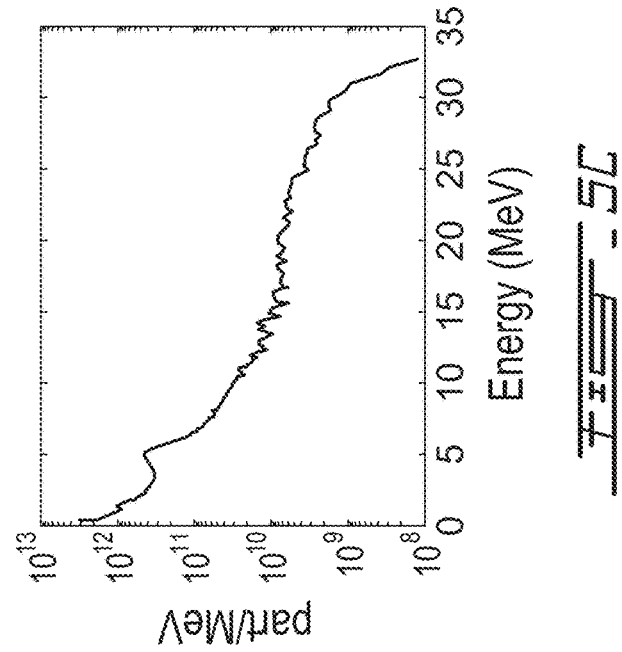
FIG. 5C shows a typical proton spectrum measured during shots.
Figure 5B:
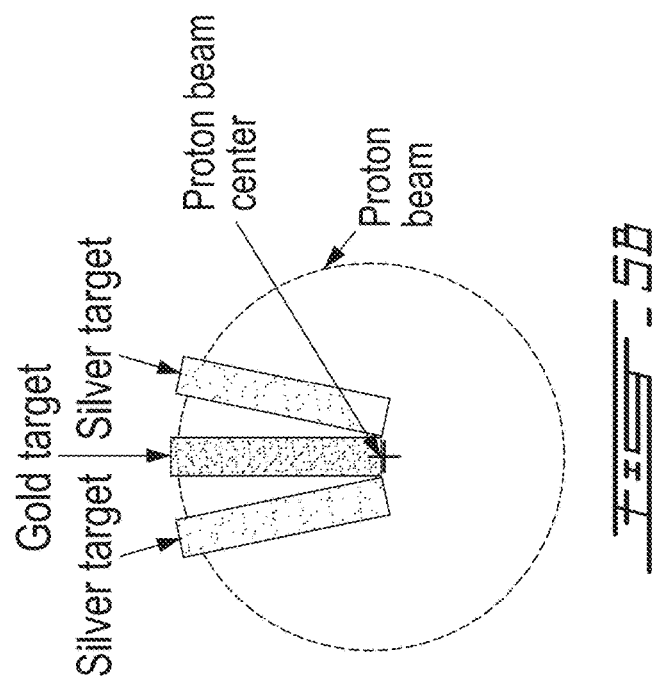
FIG. 5B is a front view of the system of FIG. 5A.

The interaction between the laser-accelerated proton beam and the irradiation gold target was modeled using a two-dimensional Monte Carlo code and using for the proton stopping power a model. The proton source as obtained in the same experimental conditions and as measured during the shots was inserted into the code (an example of proton spectrum is shown in FIG. 5C). The laser-accelerated proton beam was modeled as the projection of a proton point source with diverging rays at a certain distance, in order to have a proton source of diameter 50 µm.

The divergence half angle of the proton rays ($\alpha$) has been adjusted depending on the considered proton energy. Within the opening angle, all particles were uniformly distributed. Several simulations were run in order to find the most suitable distance in order to identify the optimum distance between proton source and the second gold target for catalyzing the above-described process.

Morphological analysis on the nanostructured surfaces was conducted by SEM and AFM microscopies. AFM images were obtained using an ICON AFM microscope from Bruker working in tapping mode. Each image was taken with a resolution of 1024×1024 pixels and a frequency of about 1 Hz. Shape and dimensions of NPs were analyzed conducting a statistical analysis on about 300 nanoparticles collected in several AFM images. For each sample, several areas were scanned in a window of 500 nm×500 nm, 1 µm×1 µm and 5 µm×5 µm. The images were elaborated using the Nano scope software (1.40 version from Bruker) to obtain a 3D structure and the particle volume using the Bearing analysis. The radius of each particle was evaluated assuming that the volume of a spherical particle is conserved during both, deposition process and interaction, with silicon substrate and/or AFM tip. SEM images were taken under a STEREOSCAN SEM microscope working with an energy of 20 keV.

Crystallinity characteristics of the surfaces were investigated by X-Ray Powder spectroscopy (XRD), using a monochromatic Bruker XRD spectrometer working with the Cu k$\alpha$ line and using a 2$\theta$ configuration at 3° of incident X-Ray beam to analyze the first 10 nanometers of the target surface. XRD spectra were analyzed with the EVA software for checking the crystallinity. A Gaussian model fit was used to evaluate the band centers and the full width at half maximum (FWHM) in order to obtain the crystallinity size. The conversion from FWHM to Standard deviation was performed using the conversion formula SD=FWHM/2.335.

Figure 6F:
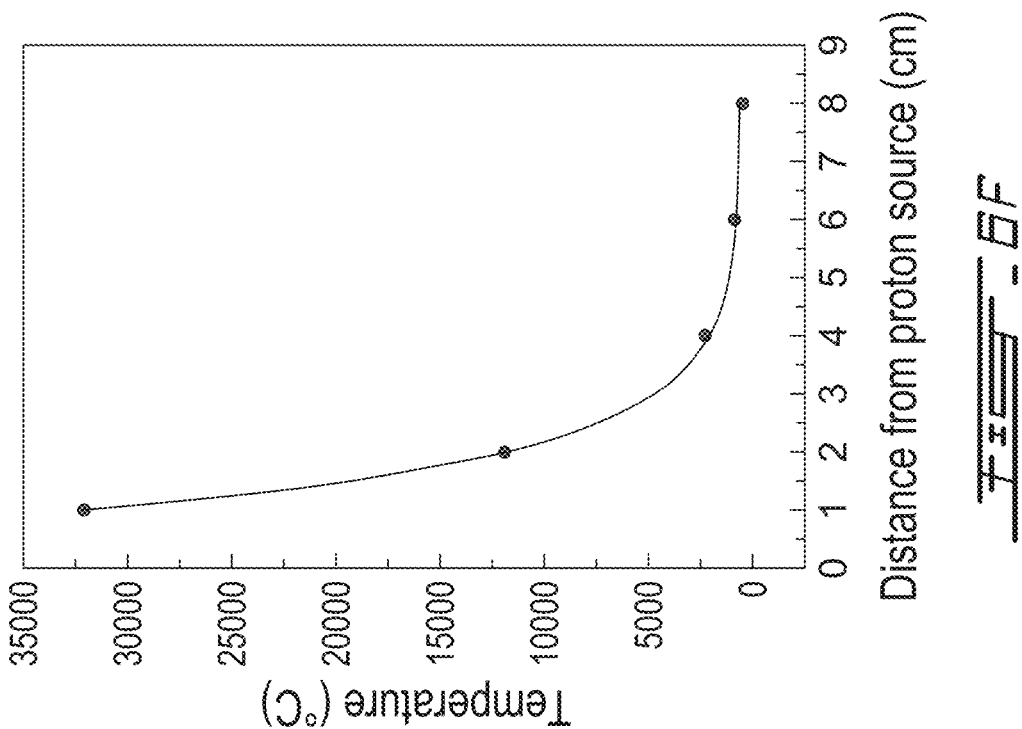
FIG. 6F shows estimated surface temperature versus distance from the proton source.
Figure 6E:
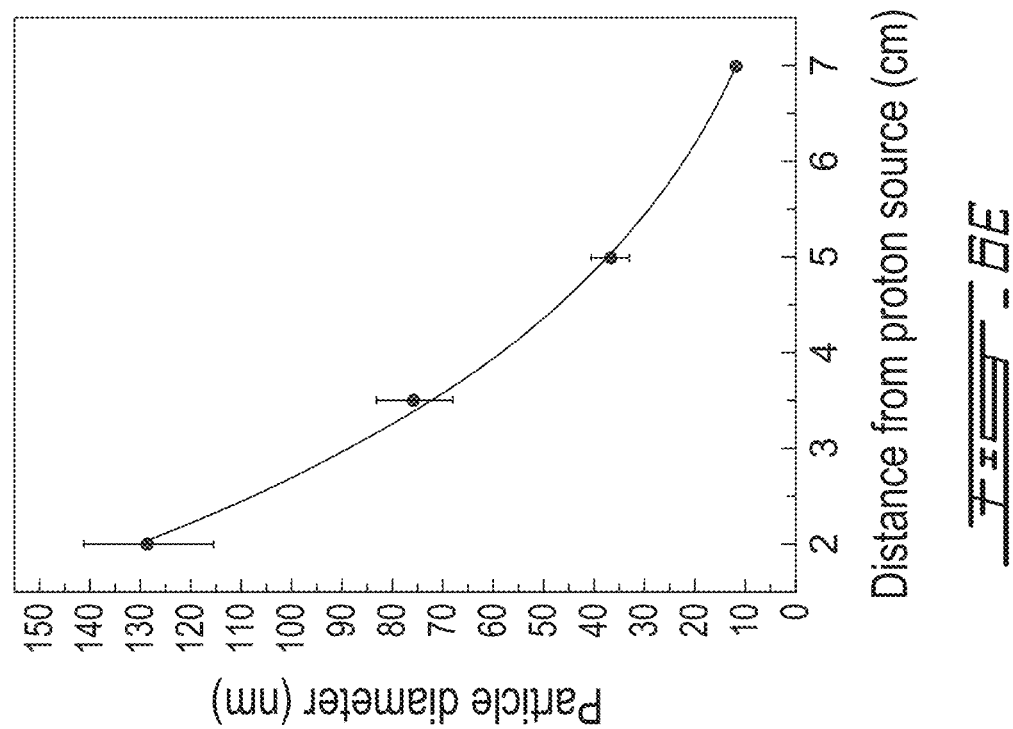
FIG. 6E shows particle diameter versus distance from the proton source.

Simulations shown in FIG. 6F indicate that the surface temperature stays above the gold boiling point of about 2800° C. for distances between the proton source and the gold target shorter than about 3 cm, between the boiling and the melting point around 1000° C. for distances between the proton source and the gold target in a range between about 3 and about 5 cm, and then decreases to temperatures of only a few hundreds of degree at distances between the proton source and the gold target in a range between about 7 and about 8 cm. From these results, a distance between the proton source and the gold plasma plume generating target between 2 and 4 cm was determined, allowing the temperature range for the explosive boiling. For shorter distances, higher temperatures destroy the gold target surface, causing the ablation of macro fragments from the target bulk and preventing the particle formation. For larger distances, up to a distance of about 7 cm, the bulk material undergoes a decreased boiling process, yielding a smaller plume and a much lower number of generated nanocrystals. For distances above about 7 cm the temperature is not sufficiently high to achieve boiling conditions.

Figure 7:
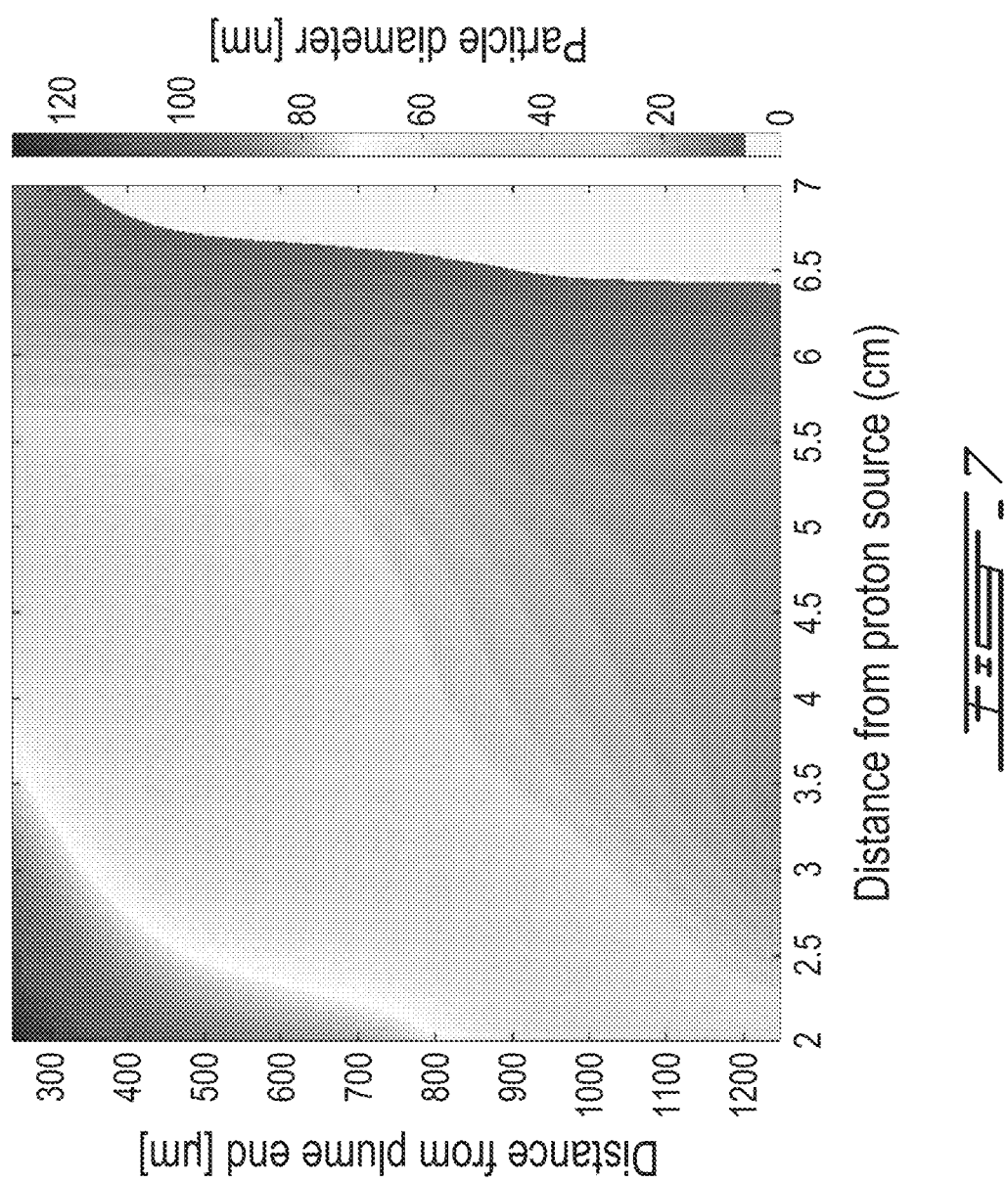
FIG. 7 is 3D particle map showing nanoparticle diameter given a specific distance from the proton source and given a specific distance from the plasma plume, interpolated from experimental data.

A more systematic study of the dependence of the distance of the produced nanoparticles from the plume target end and the dependence of produced nanoparticles on the distance of the proton source is indicated in FIG. 7. FIG. 7 shows the radial particle dimension, when fixing the distance from the proton source to different distances, namely 2, 3.5, 5 and 7 cm. It can be seen that the particle diameter decreases with increasing distance from the plume target end, in the case of a source distance of 2 cm ranging from about 130 nm for a distance from the plume target end of 250 µm to about 25 nm for a distance from the plume target end of 1250 µm. An almost linear dependency is seen, which allows tuning the nanoparticle sizes by selecting nanoparticles from zones at different distances from the plume target end.

FIG. 7 also shows that larger particles, with a diameter of about 130 nm, are obtained at closer distances from the proton source within about 2 cm, while smaller particles, of a diameter of about 5 nm, are obtained for distances of about 7 cm. In between this distance range, scaling occurs, and an increasing particle dimension with decreasing distance follows an exponential law. Linking the information about the radial distance and proton source distance dependences regarding nanocrystal size allows producing a 3D tunable nanoparticle-dimension map, in which a desired nanoparticle diameter can, at known proton irradiation pattern, be predetermined (see FIG. 7). The method therefore allows for the quick production of a priori-established high-precision tunable nanoparticles of sizes comprised in the range between about 5 and about 130 nm.

To understand the formation mechanism of nanoclusters formation via evaporation of atoms and their aggregation in the plasma plume, extensive classical Molecular Dynamics (MD) simulations were performed to analyze the behavior of a gold surface in which a large amount of energy is deposited in a very short time frame. In the simulation, an Au (100) surface was relaxed during 800 ps at a fixed temperature T=500° C. (FIG. 8A) in order to have a high temperature starting configuration in the crystalline phase.

Three regions were chosen with different temperatures: a cold zone located at z≤5 Å, in which the temperature was kept fixed at T=500° C. to impose a bulk-like behavior of the atoms; an intermediate zone located within 5 Å<z<25 Å, in which there was no temperature constraint; and a target zone located between 25 Å<z<60 Å, in which a controlled amount of energy was supplied in tens of ps to reproduce the experimental target zone in which the Au (100) surface undergoes explosive boiling.

Figure 8A:
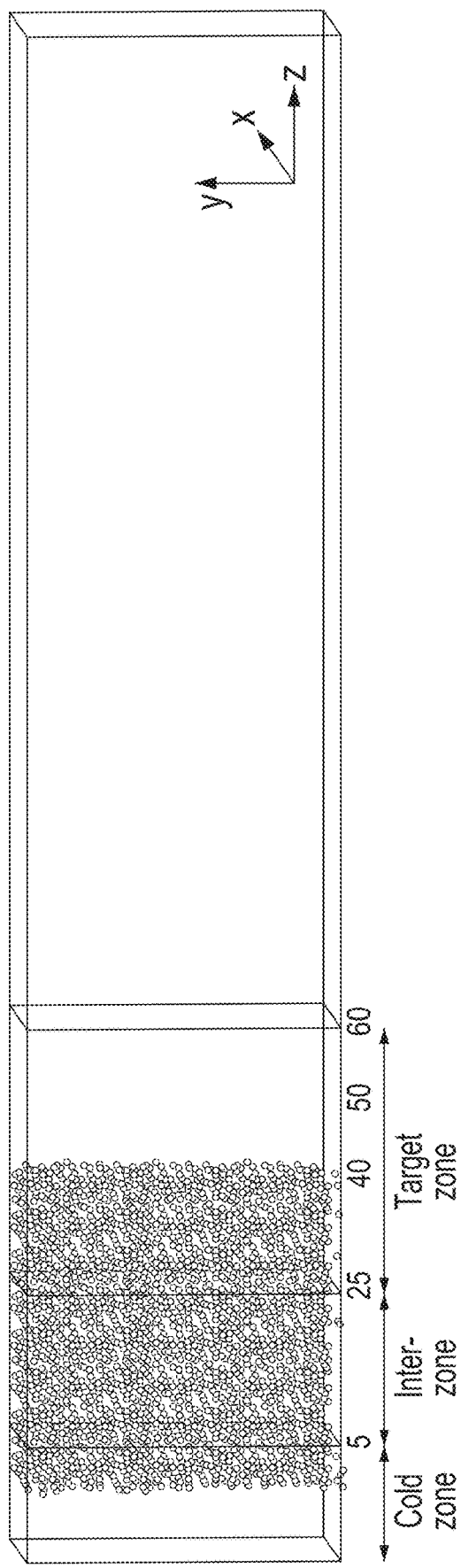
FIG. 8A is a schematic view of a gold system used as starting configuration for molecular dynamics simulations; light spheres representing gold atoms.

FIG. 8A is a schematic view of a gold system used in a starting configuration for simulations; light spheres representing gold atoms; the simulation time $t_1$ in which the prefixed temperatures T* were reached in the target zone can vary from 4 ps to 60 ps, depending on the prefixed temperature T to be reached, ranging 800° C. to 3500° C. exploring the surface behavior in the melting regime and beyond. These simulations times were considered in order to be compatible with the experimental results and adapting/scaling the results to the smaller simulation box.

For each simulation, once the target temperature T* was reached, a further simulation was performed for 20 ps (from $t_1$ to $t_2$, $t_2$ being the time that the temperature is kept constant at fixed temperature after the heating phase $t_1$) keeping the temperature T* constant in the target zone. This time interval was sufficiently long to observe the detachment of atoms and the cluster formation in the plume. In the range T* comprised in the range between about 1100 and about 2500° C. the surface was in the liquid state, but detachments of the atoms were not registered. The detaching process started at T*=2500° C. in the form of dimers and became more evident when increasing the temperature. In the high temperature limit of 3500° C. the entire process was fast enough to allow for the formation of small clusters and several cluster seeds outside the target zone, on the right side of the simulation cell, where the atoms cool down.

Figure 8B:
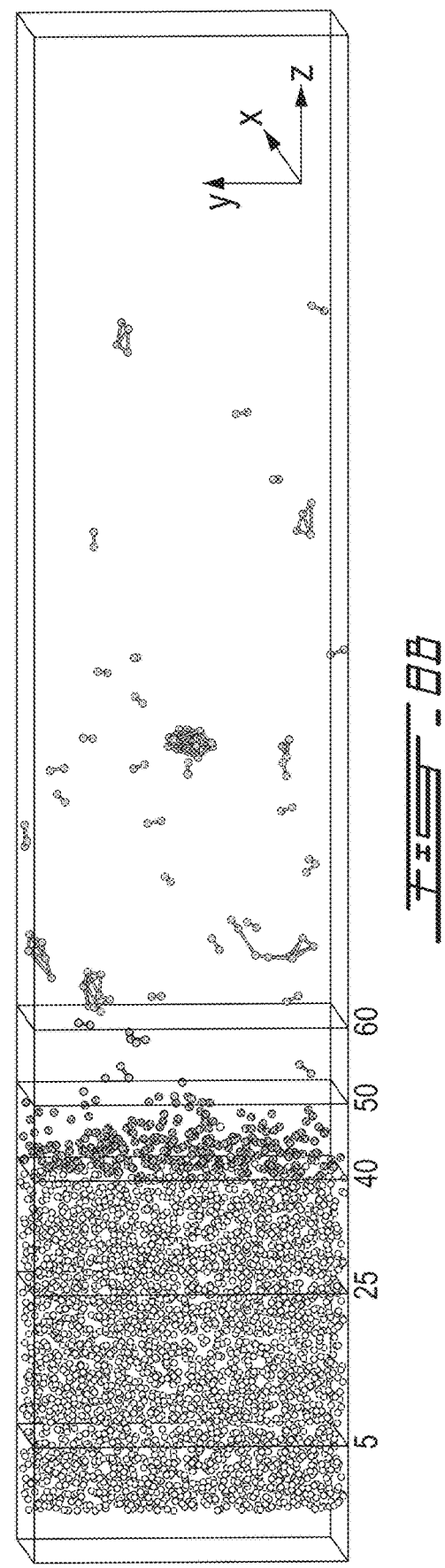
FIG. 8B is a schematic view of the Au system of FIG. 8A at the end of simulations in which the target zone is at T*=3500° C.

FIG. 8B shows the numerical cell system at the end of the simulation for the temperature T=3500° C. Atoms between 40 Å<z<50 Å represent the melted surface; atoms are located at 50 Å<z<60 Å; and atoms at z>60 Å represent the plume.

Figure 9C:
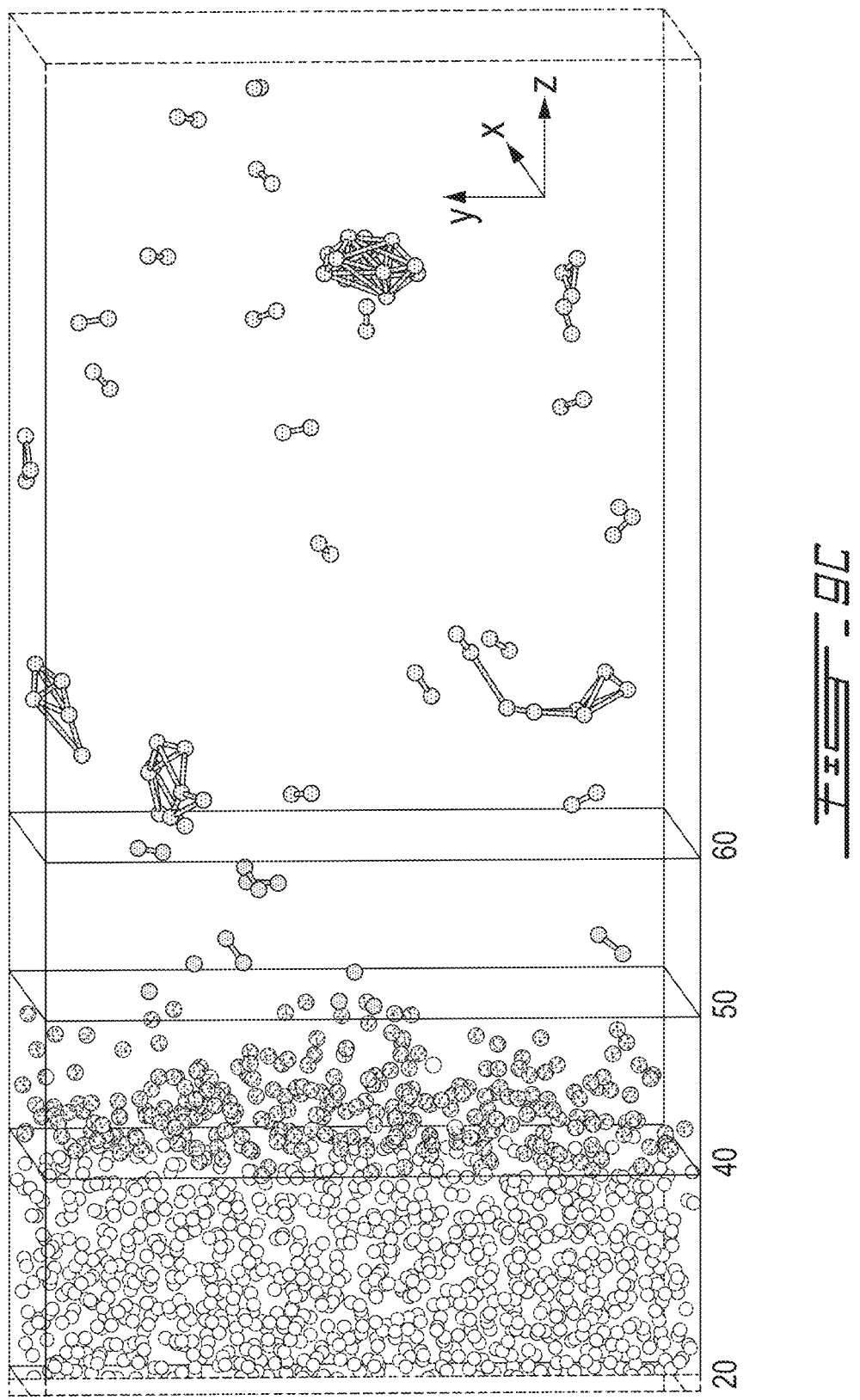
FIG. 9C shows detachment of gold atoms and the formation of clusters; dashed bold vertical line referring to the lower T* for the detachment of gold atoms; dashed light vertical line referring to the boiling temperature of gold.

To characterize the cluster formation process, FIG. 9A shows the fraction $n/T_{arget}$ versus T*, where n is the number of detached atoms and $N_{target}$=1400 is the number of gold atoms inside the target zone at the beginning of the simulation. It is interesting to note that both graphs in FIG. 9. exhibit a linear trend on a logarithmic scale indicating a significant effect of the supplied energy in short time frames on the temperature increase. Indeed, at the end of the simulation with T*=3500° C. there was about 10% of $N_{target}$ atoms segregated from the surface and involved in cluster formations. These results are highlighted by visual inspection of the system by zooming in the target zone (FIG. 9C).

To further characterize the results, the atoms located inside two areas of the target zone were identified. The two groups of atoms were dynamically selected based on their z coordinate (FIG. 8B): atoms that stay on the surface (having 40 Å<z≤50 Å), and atoms that start to leave the surface (with 50 Å≤z<60 Å). For each simulation, the distributions of the kinetic energy of these two groups of atoms averaged in the time interval $t_1$-$t_2$ (i.e. during the detachment phase) was determined.

FIG. 9B shows the mean values of the kinetic energy <K> in function of the temperature of the target zone. With regard to the atoms that stay on the surface (having 40 Å<z≤50 Å), a linear growth of the mean kinetic energy was observed. On the contrary, for the atoms that start to leave the surface (with 50 Å≤z<60 Å), the mean kinetic energy was difficult to attribute to a single tendency line. The trend is likely to occur due to superposition of two different phenomena, i.e. the interplay between an increasing supplied energy for higher temperatures, and an intensifying energy transformation occurring during the clustering phase. This clustering phase occurs at higher temperatures and reduces the kinetic energy of the atoms. Finally, in FIG. 9C the atoms with z≥60 Å have a tendency to aggregate in clusters as soon as they cool down confirming the experimental findings of cluster aggregation.

The laser-accelerated particles described hereinabove were protons. Other laser-accelerated particles may be used for quick heating of the irradiation target material to generate conditions that produce nano- and micro-crystals as described hereinabove, such as carbon ions for example; or other secondary sources such as electrons, neutrons and X-rays for example.

There is thus provided a method using laser-accelerated particles for generating micro and nanostructures with very high precision and in a single sub-ns laser shot.

The scope of the claims should not be limited by the illustrative embodiments set forth in the examples but should be given the broadest interpretation consistent with the description as a whole.

The invention claimed is:

1. A method for fabrication of crystals, comprising irradiating a solid metallic irradiation target with a laser-accelerated proton beam to induce explosive boiling and detach micro- and nano-crystals from the irradiation target and nucleation of the micro- and nano-crystals in a plasma plume composed by ions and atoms detached from the laser-irradiated irradiation target; and depositing crystals synthesized in the plasma plume on a cold solid surface of a deposition target positioned at a distance from the irradiation target.

2. The method of claim 1, wherein said heating the irradiation target comprises irradiating the irradiation target with a beam of one of: electrons, neutrons and X-rays.

3. The method of claim 1, comprising producing the laser-accelerated proton beam with an intensity of at least $10^{18}$ W/cm$^2$ and a laser pulse duration of at most 1 ps; and irradiating the irradiation target for a duration of at most 100 ns, under vacuum.

4. The method of claim 1, wherein the laser-accelerated proton beam is produced by a source target irradiated by a laser, the laser-irradates the source target with an intensity of at least 1018 W/cm2, the method comprising selecting at least one of: i) a distance between the source target and the irradiation target; ii) a number of laser-accelerated—protons from the source target per unit of irradiated surface of the irradiation target; iii) an irradiation time of the surface of the irradiation target; and iv) a power of the laser irradiating the source target depending on the melting temperature of the irradiation target.

5. The method of claim 1, wherein—the laser-accelerated proton beam is produced by a source target irradiated by a laser, the method comprising positioning the deposition target at a distance from the irradiation target, controlling properties of the deposited crystals by selecting at least one of: i) a distance between the source target and the irradiation target; ii) a number of laser-accelerated protons per unit of irradiated surface of the irradiation target; iii) irradiation time of the surface of the irradiation target; iv) a power of the laser irradiating the source target; and v) the distance between the irradiation target and the deposition target.

6. The method of claim 1, further comprising positioning a first deposition target at a first distance from the irradiation target, and a second deposition target at a second distance from the irradiation target; and recovering a first part of the crystals of the plasma plume on a surface of the first deposition target and a second part of the crystals of the plasma plume on a surface of the second deposition target.

7. The method of claim 1, wherein the crystals of the plasma plume have different sizes, the method further comprising positioning a first deposition target at a first distance from the irradiation target, and a second deposition target at a second distance from the irradiation target according to target sizes of crystals to be recovered from the plasma plume by deposition on the first deposition target and on the second deposition target respectively.

8. The method of claim 1, further comprising detaching crystals deposited on the surface of the deposition target.

9. The method of claim 1, wherein the melting temperature of the irradiation target is at most 4000° C.

10. The method of claim 1, wherein said heating the irradiation target comprises irradiating the irradiation target with laser-accelerated carbon ions.

11. A method for fabrication of crystals, comprising irradiating a first target with a laser-accelerated proton beam to induce explosive boiling and detach micro- and nano-crystals from the first target and nucleation of the micro- and nano-crystals in a plasma plume composed by ions and atoms detached from the laser-irradiated first target; and depositing crystals synthesized in the plasma plume on a cold surface of a second target positioned at a distance from the first target.

12. The method of claim 11, comprising selecting a material of a melting temperature of at most 4000° C. for said first target.

13. The method of claim 11, wherein the laser-accelerated proton beam has a pulse duration in a range between 10 ps and 50 ns.

* * * * *